United States Patent
Fick et al.

(10) Patent No.: US 10,903,844 B2
(45) Date of Patent: Jan. 26, 2021

(54) SYSTEM AND METHODS FOR MIXED-SIGNAL COMPUTING

(71) Applicant: Mythic, Inc., Austin, TX (US)

(72) Inventors: Laura Fick, Austin, TX (US); Manar El-Chammas, Austin, TX (US); Skylar Skrzyniarz, Austin, TX (US); David Fick, Austin, TX (US)

(73) Assignee: Mythic, Inc., Austin, TX (US)

( * ) Notice: Subject to any disclaimer, the term of this patent is extended or adjusted under 35 U.S.C. 154(b) by 0 days.

(21) Appl. No.: 16/683,553

(22) Filed: Nov. 14, 2019

(65) Prior Publication Data
US 2020/0083897 A1    Mar. 12, 2020

Related U.S. Application Data

(63) Continuation of application No. 16/459,841, filed on Jul. 2, 2019, now Pat. No. 10,523,230, which is a continuation of application No. 16/285,619, filed on Feb. 26, 2019, now Pat. No. 10,389,375.

(60) Provisional application No. 62/644,908, filed on Mar. 19, 2018.

(51) Int. Cl.
    *H03M 1/12*     (2006.01)
    *H03M 1/14*     (2006.01)
    *H03F 3/45*     (2006.01)

(52) U.S. Cl.
    CPC ........ *H03M 1/145* (2013.01); *H03F 3/45968* (2013.01); *H03F 2203/45551* (2013.01)

(58) Field of Classification Search
    CPC ........................ H03M 1/45; H03F 2203/45551

USPC .................................................. 341/155, 156
See application file for complete search history.

(56) References Cited

U.S. PATENT DOCUMENTS

| | | | |
|---|---|---|---|
| 4,275,386 A * | 6/1981 | Michel .................. | H03M 1/125 341/159 |
| 5,017,919 A | 5/1991 | Hull et al. | |
| 5,167,008 A | 11/1992 | Engeler | |
| 5,444,446 A | 8/1995 | Gopinathan et al. | |
| 5,559,722 A | 9/1996 | Nickerson | |

(Continued)

OTHER PUBLICATIONS

International Search Report and Written Opinion of the ISA, dated Nov. 19, 2018, for application No. PCT/US18/50366.

(Continued)

*Primary Examiner* — Peguy Jean Pierre
(74) *Attorney, Agent, or Firm* — Padowithz Alce

(57) ABSTRACT

A mixed-signal integrated circuit that includes: a global reference signal source; a first summation node and a second summation node; a plurality of distinct pairs of current generating circuits arranged along the first summation node and the second summation node; a first current generating circuit of each of the plurality of distinct pairs that is arranged on the first summation node and a second current generating circuit of each of the plurality of distinct pairs is arranged on the second summation node; a common-mode current circuit that is arranged in electrical communication with each of the first and second summation nodes; where a local DAC adjusts a differential current between the first second summation nodes based on reference signals from the global reference source; and a comparator or a finite state machine that generates a binary output value current values obtained from the first and second summation nodes.

20 Claims, 18 Drawing Sheets

(56) References Cited

U.S. PATENT DOCUMENTS

| | | | |
|---|---|---|---|
| 6,690,310 B1 | 2/2004 | Upton | |
| 7,157,941 B2 | 1/2007 | Koo | |
| 8,013,761 B2 | 9/2011 | Mayer | |
| 8,339,179 B2 | 12/2012 | Sun et al. | |
| 9,176,512 B2 | 11/2015 | Singnurkar | |
| 9,991,001 B2 | 6/2018 | Maayan et al. | |
| 10,255,551 B2 | 4/2019 | Fick et al. | |
| 2002/0163456 A1 | 11/2002 | Dedic | |
| 2005/0134493 A1* | 6/2005 | Lin | H03M 1/145 |
| | | | 341/155 |
| 2006/0214827 A1* | 9/2006 | Sherry | H03M 1/1014 |
| | | | 341/120 |
| 2011/0119215 A1 | 5/2011 | Elmegreen et al. | |
| 2012/0293229 A1* | 11/2012 | Mailand | G06G 7/14 |
| | | | 327/306 |
| 2014/0376676 A1 | 12/2014 | Schafferer | |
| 2016/0182260 A1 | 6/2016 | Dong | |
| 2016/0373120 A1 | 12/2016 | Caffee et al. | |
| 2017/0288692 A1* | 10/2017 | Kauffman | H03M 1/0607 |

OTHER PUBLICATIONS

International Search Report and Written Opinion of the ISA, dated May 10, 2019, for application No. PCT/US19/019537.

* cited by examiner

Receiving Input Signals S210

Generating Differential Current Signals S220

Adjusting the Differential Currents S230

Sourcing Predetermined Differential Currents S240

Generating an Output Signal S245

Identifying A Weighted Sum Difference S260

FIGURE 2

SYSTEM AND METHODS FOR MIXED-SIGNAL COMPUTING

CROSS-REFERENCE TO RELATED APPLICATIONS

This application is a continuation of U.S. patent application Ser. No. 16/459,841, filed 2 Jul. 2019, which is a continuation of U.S. Pat. No. 10,389,375, filed 26 Feb. 2019, which claims the benefit of U.S. Provisional Application No. 62/644,908, filed 19 Mar. 2018, which are all incorporated herein in their entireties by this reference.

TECHNICAL FIELD

The inventions described herein relate generally to the integrated circuitry architecture field, and more specifically to new and useful mixed-signal integrated circuits and methods of computing mixed-signals in the integrated circuitry architecture field.

BACKGROUND

Today, the various implementations of artificial intelligence and machine learning are driving innovation in many fields of technology. Artificial intelligence (AI) systems and artificial intelligence models (including algorithms) are defined by many system architectures and models that enable machine learning (deep learning), reasoning, inferential capacities, and large data processing capabilities of a machine (e.g., a computer and/or a computing server). These AI systems and models are often trained intensively to perform one or more specific tasks, such as natural language processing, image recognition, planning, decision-making, and the like. For example, a subset of these AI systems and models include artificial neural network models. The training of an artificial neural network model may, in many cases, require thousands of hours across the training cycle and many terabytes of training data to fine tune associated neural network algorithm(s) of the model before use.

However, once trained, a neural network model or algorithm may be deployed quickly to make inferences to accomplish specific tasks (e.g., recognizing speech from speech input data, etc.) based on relatively smaller datasets when compared to the larger training datasets used during the training cycle. The inferences made by the neural network model or algorithm based on the smaller datasets may be a prediction about what the neural network model calculates to be a correct answer or indication about a circumstance.

Still, while neural network models implementing one or more neural network algorithms may not require a same amount of compute resources, as required in a training phase, deploying a neural network model in the field continues to require significant circuitry area, energy, and compute power to classify data and infer or predict a result. For example, weighted sum calculations are commonly used in pattern matching and machine learning applications, including neural network applications. In weighted sum calculations, an integrated circuit may function to multiply a set of inputs ($x_i$) by a set of weights ($w_i$) and sum the results of each multiplication operation to calculate a final result (z). Typical weighted sum calculations for a machine learning application, however, include hundreds or thousands of weights which causes the weighted sum calculations to be computationally expensive to compute with traditional digital circuitry. Specifically, accessing the hundreds or thousands of weights from a digital memory requires significant computing time (i.e., increased latency) and significant energy.

Accordingly, traditional digital circuitry required for computing weighted sum computations of a neural network model or the like tend to be large to accommodate a great amount of digital memory circuitry needed for storing the hundreds of thousands of weights required for the neural network model. Due to the large size of the circuitry, more energy is required to enable the compute power of the many traditional computers and circuits.

Additionally, these traditional computers and circuits for implementing artificial intelligence models and, namely, neural network models may be suitable for remote computing processes, such as in distributed computing systems (e.g., the cloud), or when using many onsite computing servers and the like. However, latency problems are manifest when these remote artificial intelligence processing systems are used in computing inferences and the like for remote, edge computing devices or in field devices. That is, when these traditional remote systems seek to implement a neural network model for generating inferences to be used in remote field devices, there are unavoidable delays in receiving input data from the remote field devices because the input data must often be transmitted over a network with varying bandwidth and subsequently, inferences generated by the remote computing system must be transmitted back to the remote field devices via a same or similar network.

Implementing AI processing systems at the field level (e.g., locally at the remote field device) may be a proposed solution to resolve some of the latency issues. However, attempts to implement some of these traditional AI computers and systems at an edge device (e.g. remote field device) may result in a bulky system with many circuits, as mentioned above, that consumes significant amounts of energy due to the required complex architecture of the computing system used in processing data and generating inferences. Thus, such a proposal without more may not be feasible and/or sustainable with current technology.

Accordingly, there is a need for a deployable system for implementing artificial intelligence models locally in the field (e.g., local AI), and preferably to be used in edge devices, that do not result in large, bulky (edge) devices, that reduces latency, and that have necessary compute power to make predictions or inferences, in real-time or substantially real-time, while also being energy efficient.

The below-described embodiments of the present application provide such advanced and improved integrated circuits and implementation techniques capable of addressing the deficiencies of traditional systems and integrated circuit architectures for implementing AI and machine learning.

SUMMARY OF THE INVENTION

In one embodiment, an integrated circuit includes: a binary-weighted global reference signal source that drives a plurality of local differential current circuits; a first summation node and a second summation node, wherein the first summation node and the second summation node are arranged in electrical communication with one differential current circuit of the plurality of differential current circuits; a plurality of distinct pairs of programmable current sources arranged along the first summation node and the second summation node, wherein a first programmable current source of each of the plurality of distinct pairs is arranged on the first summation node and a second programmable current source of each of the plurality of distinct pairs is arranged on the second summation node; wherein each pair of the plurality of distinct pairs of programmable current sources sets a differential current signal between the first summation node and the second summation node based on an input signal; a common-mode control circuit that is arranged in electrical communication with each of the first summation node and the second summation node and that sources to or sinks from each of the first summation node and the second summation node a common current value; the local differential current circuit adjusts the differential current between the first summation node and the second summation node based on one or more reference signals from the binary-weighted global reference source; and a comparator that evaluates analog values based on outputs of the first summation node and the second summation node and generates a binary output value based on the evaluation.

In one embodiment, the local differential current circuit adjusts the differential current between the first summation node and the second summation node until a summation of an output a first current value of the first summation node and an output of a second current value of the second summation node equals zero.

In one embodiment, the comparator assesses a relative state of a summed current value in each of the first summation node and the second summation node and determines which of the first summation node and the second summation node has a larger current value or smaller current value.

In one embodiment, the local differential current circuit increases or decreases the differential current signal between the first summation node and the second summation node by sourcing to the first summation node and the second summation node a progressively smaller differential current signal increment based on which of the first summation node and the second summation node outputs a current signal value with a higher magnitude.

In one embodiment, the common-mode circuit comprises one of a single-amplifier driven circuit and a switched capacitor feedback circuit that sources the common-mode current value to each of the first summation node and the second summation node.

In one embodiment, the switched capacitor feedback circuit includes: a first amplifier that drives a target voltage value that tracks a generated common-mode feedback voltage; and a second amplifier that shields against sensitive output voltages from switching signals in the common-mode feedback circuit.

In one embodiment, the common-mode current circuit comprises a compensation circuit that includes at least two amplifier that is each arranged in electrical communication with one of two transistors and that each drive a gate voltage at each of the two transistors to a desired common-mode voltage.

In one embodiment, the common-mode current circuit comprises a compensation circuit that includes a single amplifier that is each arranged in electrical communication with each of two transistors and that switches between each of the two transistors to drive a gate voltage at each of the two transistors to a desired common-mode voltage.

In one embodiment, the common-mode current circuit comprises a compensation circuit that includes a front-end amplifier that is auto-zeroed by shorting output voltages to capacitive input nodes of the first summation node and the second summation node, wherein an output voltage differentials of the front-end amplifier are stored as gate voltages on at least two transistors.

In one embodiment, the binary-weighted global reference signal source executes a binary search algorithm such that at each step of the binary search algorithm, the binary-weighted global reference signal source sets a binary-weighted value with which each of the plurality of local differential current circuits to adjust a respective local state of each of the plurality of local differential current circuits.

In one embodiment, each of the plurality of local differential current circuits: is arranged along a shared signal path; is arranged in electrical communication with distinct pairs of summation nodes; the binary-weighted global reference source sources a plurality of binary-weighted signals along the shared signal path to each of the plurality of local differential current circuits.

In one embodiment, a mixed-signal integrated circuit includes: a global reference signal source that drives a plurality of local digital-to-analog converters (DACs); a first summation node and a second summation node, wherein the first summation node and the second summation node are arranged in electrical communication with one local DAC of the plurality of local DACs; a plurality of distinct pairs of current generating circuits arranged along the first summation node and the second summation node, wherein a first current generating circuit of each of the plurality of distinct pairs is arranged on the first summation node and a second current generating circuit of each of the plurality of distinct pairs is arranged on the second summation node; wherein each pair of the plurality of distinct pairs of current generating circuits sets a differential current signal between the first summation node and the second summation node based on an input signal; a common-mode current circuit that is arranged in electrical communication with each of the first summation node and the second summation node and that sources to or sinks from each of the first summation node and the second summation node a common current value; the local DAC adjusts the differential current between the first summation node and the second summation node based on one or more reference signals from the global reference source; and a comparator or a finite state machine that evaluates analog values based on outputs of the first summation node and the second summation node and generates a binary output value based on the evaluation.

In one embodiment, the global reference source executes one of a binary search algorithm, a least significant bit search algorithm, a non-binary search algorithm, a logarithmic search algorithm, and a custom user-defined search function.

In one embodiment, a method of implementing an integrated circuit includes: receiving an analog input signal at each of a plurality of distinct programmable current sources; generating, by each of the plurality of distinct programmable current sources, differential current signals based on applying the analog input signal across each of the plurality of distinct programmable current sources; sourcing, by each of the plurality of distinct programmable current sources, the differential current signals to a first summation node and a second summation node; measuring an average voltage between the first summation node and the second summation node; in response to the measurement, sourcing a common current signal to each of the first summation node and the second summation node; sourcing, by a local differential current source, search-based differential current signals to the first summation node and the second summation node; and generating a binary output value based on a weighted sum difference of the differential current signals of the first summation node and the second summation node.

In one embodiment, the local differential current source sources a known, changing current signal to each of the first summation node and the second summation node that is equal in magnitude but opposite in direction.

In one embodiment, the method further includes implementing a global reference source comprising an N-bit global digital-to-analog converter that sources a total of N bits of reference signals to the local differential current source over a total of N cycles for performing a computation.

In one embodiment, the method further includes assessing the differential current signals along the first summation node and the second summation node; returning an output signal to the local differential current source, wherein the output signal indicates a position of a measured voltage of the first summation node and the second summation node with respect to a target voltage.

In one embodiment, the method further includes after N cycles, computing a weighted sum difference value between summed current values of each of the first summation node and the second summation node; and converting the weighted sum difference to a binary output code.

BRIEF DESCRIPTION OF THE FIGURES

FIG. 2 illustrates a method for performing a weighted sum computation using an integrated circuit in accordance with one or more embodiments of the present application;

DESCRIPTION OF THE PREFERRED EMBODIMENTS

Figure 1:
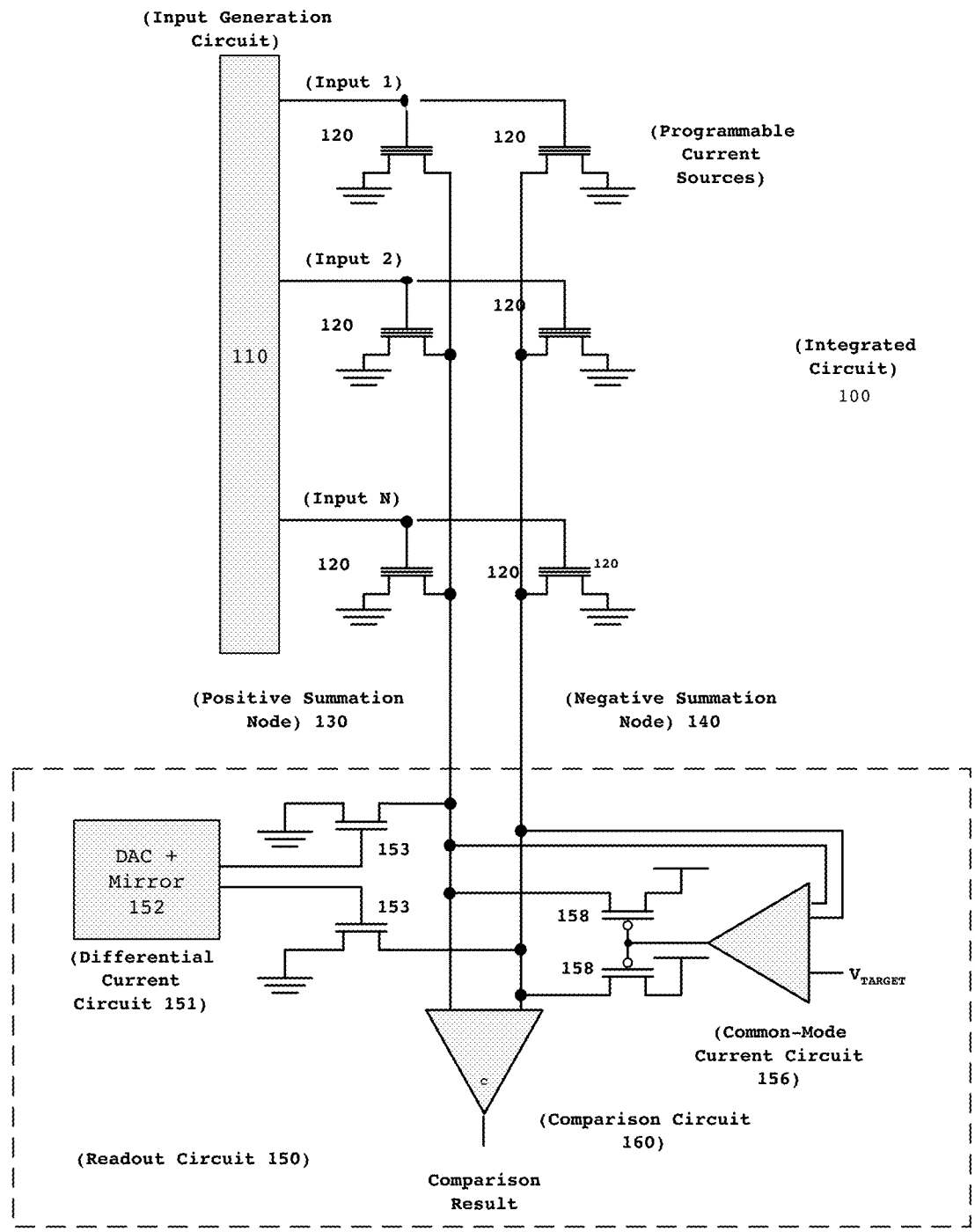
FIG. 1 illustrates a schematic of an integrated circuit 100 in accordance with one or more embodiments of the present application.

The following description of preferred embodiments of the present application are not intended to limit the inventions to these preferred embodiments, but rather to enable any person skilled in the art of to make and use these inventions.

I. Mixed-Signal Compute Overview

In traditional integrated circuits used in implementing computationally-intensive programs or applications (e.g., deep neural network algorithms) and the like, the typical integrated circuit (IC) architecture includes relatively large circuits requiring large area and power to operate and perform computations. This is because processing digital signals (e.g., binary signals) often requires large and power-hungry implementations of circuits. Thus, for many technological implementations of computationally-intensive programs, such as artificial intelligence models, the resulting computer ICs having these large circuits for processing digital signals are also large and therefore, less feasible to include in space-constrained edge devices and the like.

Further, a great majority of the computational effort of an integrated circuit in implementing computationally-intensive applications, such as neural network models, involve performing thousands to millions of matrix multiplications. Further, in digital signal processing for neural network models, multiply-accumulate operations may also be performed in which a product of two numbers is computed and the product then added to an accumulator. Thus, when neural network models are implemented using only or primarily digital circuitry, the resulting digital circuitry consumes large amounts of energy performing the calculations and storing weight coefficients for neurons and resultant products of the many multiply-accumulate operations.

As a technical solution to reduce power required for computing and an overall size of an integrated circuit that is capable of computationally-intensive processes includes providing mixed-signal computing architectures that may be implemented utilizing extremely area efficient digital-to-analog converters (DACs) (rather than standard DACs which are fundamentally large, or area-intensive) along-side the various other circuitry of an integrated circuit to achieve area and energy efficiencies. Therefore, while traditional implementations of DAC architectures may be useful to reduce energy required by and an overall size of an integrated circuit, these traditional implementations of DAC architectures may not be feasible due to the large number of DACs that may be necessary to process computationally-intensive AI programs and applications.

The embodiments of the present application, however, solve at least the above-noted technical problems by implementing, in various forms, a global (reference signal source) DAC that may be in operable communication with one or more analog-to-digital converters.

Accordingly, an integrated circuit is provided that performs weighted sum computations. The integrated circuit preferably includes: a plurality of current generation elements interconnected and arranged into pairs, a positive summation node, a negative summation node, and an input generation circuit. For each pair of current generation elements, the control terminal of each element is electrically connected to an input node. One of the current generation elements has a terminal (e.g., a drain or the like)) connected to the positive summation node while the other current generation element has a terminal (e.g., a drain or the like) connected to the negative summation node. The remaining terminals on both current generation elements are connected to a reference, which may be shared. Each pair of current generation elements source predetermined amounts of current onto the two summation nodes when the following conditions occur: the input node is at an activation voltage, and the two summation nodes are at a predetermined target voltage. The activation voltage as referred to herein relates to a voltage value at which current sourced by the programmable current sources begin to increase with voltage. Thus, the activation voltage may relate to a voltage value that causes the programmable current sources to produce detectable current signals. The difference in these two sourced currents represent a value, and the value varies among the plurality of current generation element pairs. Since each pair is electrically connected to the same two summation nodes, their currents naturally sum on these nodes so that the total difference in current between the two nodes is equal to the sum of the pair values.

To accomplish the above, the integrated circuit includes a common-mode current generation circuit, a differential current generation circuit, and a comparison circuit. The common-mode current circuit measures the average voltage of the two summation nodes and outputs an equal current to each node such that the average voltage becomes equal to the target voltage. The differential current circuit outputs a known, changing current to each line that is equal in magnitude but opposite in direction. Additionally, or alternatively, as discussed herein the differential current circuit may function to output known, changing current to each line that vary in magnitude in a same (i.e., same sign) or opposite direction (e.g., different signs). The comparison circuit outputs a signal which indicates which summation line is greater in voltage. When the comparison output circuit changes, it is known that the two summation nodes were momentarily equal to the target voltage (e.g., crossing), the current being generated by the differential current circuit was equal to the summation value, and that the value of the differential current can be recorded as the result.

Accordingly, a reduction in DAC architecture area may be achieved and, computer and power efficiencies that enable edge computing devices and the like to perform complex and computer-intensive operations including AI computing locally at a source of the input data.

II. Arrayed DAC Overview

As an improvement to the mixed-signal compute architecture described above, one or more embodiments of the present application implements a global (reference signal source) DAC that is in operable communication and control of a plurality of local (output) DACs as described in U.S. Provisional Application No. 62/559,354 and U.S. patent application Ser. No. 16/127,488, which are incorporate into this application in their entireties by this reference. The embodiments thereof and further, described herein function to solve a fundamental technical problem with mixed-signal computing architectures by enabling a creation of many precise DACs without consuming a very large area on a chip. By contrast, modern DACs may typically become large due to matching constraints on their various components, which dictate the lower bound on device size. This technical problem becomes further apparent and problematic once the DAC resolution surpasses 6-8 bits. Consequently, these traditional DACs may not be energy or size efficient once noise and speed are considered in the DAC's architecture.

The global (reference) DAC functions as a signal source (in some embodiments, the only reference signal source) to each of the local (mirror) DACs. In a preferred embodiment, the local DACs function to serially accumulate analog reference signals generated by the global DAC over a number of clock cycles. In such embodiment, the accumulation by each of the local DACs is onto a capacitor or other energy storage device for providing a new or total output (e.g., a charge representing the accumulation of the reference signals).

Accordingly, implementing the global DAC in the manner described above enables a reduction of a number of high-precision reference devices required for driving the local DACs, as each local DAC would typically require respective dedicated reference devices that provide a reference signal. In traditional DACs, a reference signal generation as well as output circuitry may be usually integrated into a single large DAC. Accordingly, in several embodiments of the present application, the global DAC functions to provide precise source signaling to each of a plurality of local DACs therefore ameliorating the matching requirement for implementing accurate DACs and more specifically, a need for a plurality of reference signal source DACs to drive a plurality local output DACs (e.g., eliminating 1-to-1 match). Accordingly, a reduction in DAC architecture area may be achieved and, computer and power efficiencies that allow edge computing devices and the like to perform complex and computer-intensive operations including AI computing locally at a source of the input data.

III. Binary Matrix Overview

While the mixed-signal compute circuits implementing an architecture that includes an array of local DACs controlled by a global DAC provides significant operational and chip size efficiencies over traditional integrated circuits, there still exist opportunities to improve the operational efficiencies and increase the computation speeds thereof.

Accordingly, one or more embodiments of the present application, beneficially implement an arrayed DAC topology that enables one DAC per analog-to digital converter (ADC) architecture and that also allows a use of binary search algorithms, which require only N cycles per calculation rather than $2^N$ cycles per calculation. The technical benefit of such implementation includes energy efficiencies (less energy usage) and improved operational performance (e.g., faster computations) of an integrated circuit during matrix multiply calculations and/or similar computations.

For instance, in the implementation of a non-binary weighted global DAC to some ADC architectures, the global DAC is typically required to perform a basic or a full sweep of bit values. In such instance, if an 8-bit global DAC is implemented, the 8-bit global DAC would function to sweep through 256-bit values ($2^8$) and correspondingly, generate 256 reference signals to each of ADC of an array. Accordingly, it requires at least 256 clock cycles to perform a calculation using such implementation.

As mentioned above, a binary-weighted DAC is proposed that functions to perform an N-bit calculation in approximately N cycles.

It shall be noted that any suitable search algorithm may be implemented beyond a binary search including, but not limited to, an LSB-first binary search, a non-binary IV. Mixed-Signal Compute Architecture As shown in FIG. 1, an integrated circuit 100 for implementing mixed-signal computing for computationally-intensive programs and/or applications includes an input circuit 110, a plurality of programmable current sources 120, a first summation node 130, a second summation node 140, and a readout circuit 150 (e.g., an analog-to-digital converter (ADC)). Preferably, the readout circuit 150 includes a differential current circuit 151 and a common-mode current circuit 156, as shown by way of example in FIG. 8A.

The integrated circuit 100 preferably functions to perform weighted sum computations for compute-intensive applications or programs in the analog domain (rather than the digital domain) by pre-storing computation weights or similar coefficients in current generation elements (e.g., the plurality of programmable current sources, etc.) and using the current generation elements to generate current values in response to an input while mixed-signal circuitry may be implemented to identify an output code (e.g., a digital output) based on a weighted-sum calculation of the current values produced by the current generation elements.

The input (generation) circuit 110 preferably functions to provide an input signal to one or more of an array of programmable current sources 120. In some embodiments, the input circuit no is configured to generate and/or provide a set of input signals for a plurality of programmable current sources 120. The input circuit may function to receive a digital (e.g., binary) input signal or analog input signal from one or more input signal sources. The one or more input signal sources may include another integrated circuit layer that is in operable signal communication with the input circuit 110, an external input sensor (e.g., a camera, etc.), a switch, an off-chip device or circuit (e.g., off-chip memory, etc.), and the like. The input circuit no may additionally or alternatively function to provide digital input signals within the integrated circuit 100 within a multi-step fashion in which each pair of programmable current sources receives a series of input signals and in response, generate a series of corresponding outputs.

In some embodiments, the input circuit 110 may be configured as a single circuit with multiple signal output ports where each of the multiple output ports may be in electrical communication with a signal input terminal of a programmable current source 120. That is, each signal output port may be electrically coupled or otherwise, electrically connected to a corresponding signal input receiving terminal of a programmable current source 120 or of paired programmable current sources 120. Additionally, or alternatively, the input circuit no may be configured as multiple disparate circuits where each of the multiple disparate circuits includes a single signal output port that is placed in electrical communication with a signal input terminal of a programmable current source 120.

In some embodiments, the input circuit 110 may be configured to convert a digital input signal to an analog input signal. In such embodiments, the input circuit 110 may include a digital-to-analog converter that functions to receive digital input signals and convert the digital input signals to an analog output signals comprehensible to the analog circuitry of circuit 100. For instance, the input circuit 110 may function to receive a binary input signal from a digital sensor and convert the binary input signal to a voltage signal and pass the voltage signal to a programmable current source 120. Accordingly, the input circuit 110 may include a voltage controller circuit (e.g., a microcontroller having a computer processor or the like) that is configured to generate varying voltage signals based on received input signals to control the programmable current sources 120.

In a preferred embodiment, the plurality of programmable current sources 120 may be arranged in pairs that are placed in electrical communication or are electrically connected by connecting gate terminals of the programmable current sources 120 in the pair; however, it shall be noted that the programmable current sources may be connected as pairs in any suitable manner. Preferably, disparate pairs of programmable current sources are arranged in rows or columns thereby forming a columnar or longitudinal array; however, in various embodiments, pairs of programmable current sources may be arranged in more or less than three rows or in any suitable number of rows. Additionally, each electrically connected pair of programmable current sources 120 may further be placed in electrical communication with or may be electrically connected to the input circuit 110, as mentioned above. That is, one or more gate terminals of a pair of programmable current sources 120 may be used to electrically connect the pair of programmable current sources 120 to each other as well as to an input node (port) or circuit of the input circuit 110. In some embodiments, each pair of programmable current sources 120 includes a control terminal that is arranged in electrical communication with an output node of the input circuit no and one or more terminals of the pair may be connected to a reference generator or reference circuit, which may be shared among each of a plurality of paired programmable current sources. The reference generator, in some embodiments, comprises any suitable reference source, such as a global digital-to-analog converter (DAC) that may function to generate and source reference values for each pair of programmable current sources 120. The result of such configuration being that the input circuit 110 may be capable of transmitting a single input signal through a gate terminal of a pair of programmable current sources 120 and each of the current sources in the pair would function to receive the same single input signal from the input circuit no.

A source terminal of each programmable current source 120 of a pair of programmable current sources 120 may be connected to ground or any suitable reference voltage while a drain terminal of each programmable current source 120 is connected to a respective current summation node. In a preferred embodiment, a drain terminal of a first programmable current source 120 of a pair of current sources may be electrically connected to a first current summation node 130 and a drain terminal of a second programmable current source 120 of the pair of current sources may be electrically connected to a second current summation node 140. Likewise, a source terminal of each of the first programmable current source 120 and the second programmable current source 120 of the pair of current sources may be electrically connected to a respective ground or to any suitable reference voltage.

In a preferred embodiment, an array of paired programmable current sources 120 may be arranged in the circuit 100. In such embodiment, a first programmable current source of each paired programmable current sources 120 of the array may share a first current summation node 130 and a second programmable current source of each paired programmable current sources 120 may share a second current summation node 140. The first summation node 130, in such embodiment, may function to sum positive currents supplied by each of the first programmable current sources and the second summation node 140 may function to sum currents representing negative values (e.g., negatively weighted currents) supplied by each of the second programmable current sources. Accordingly, the array of paired programmable current sources 120 may be arranged in circuit 100 to take advantage of Kirchhoff's current law (KCL) for the purpose of summing the current supplied by the array of programmable current sources 120 along each of the first and second summation nodes 130, 140.

Figure 3:
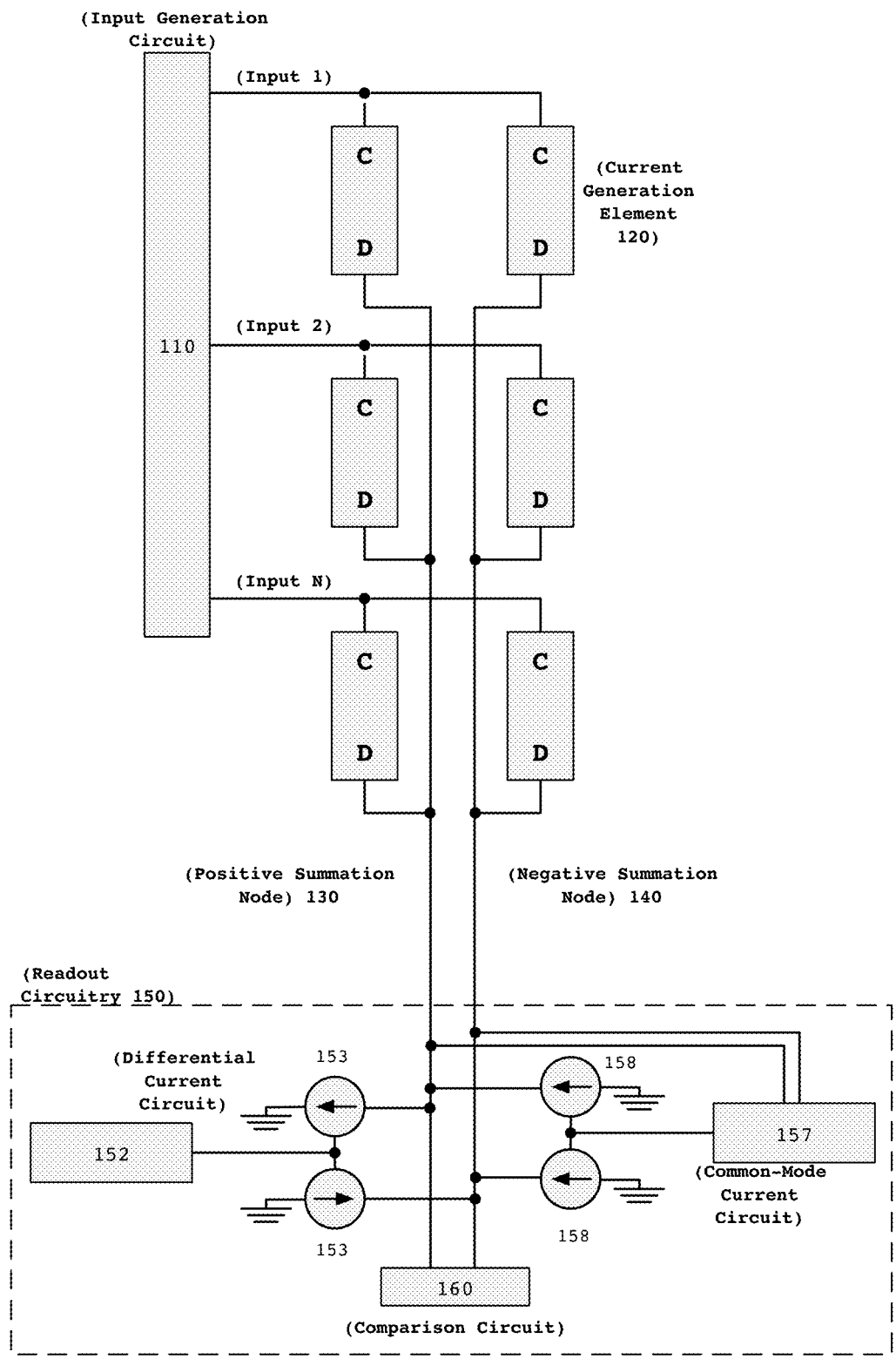
FIG. 3 illustrates a second schematic architecture of an integrated circuit in accordance with one or more embodiments of the present application.
Figure 4:
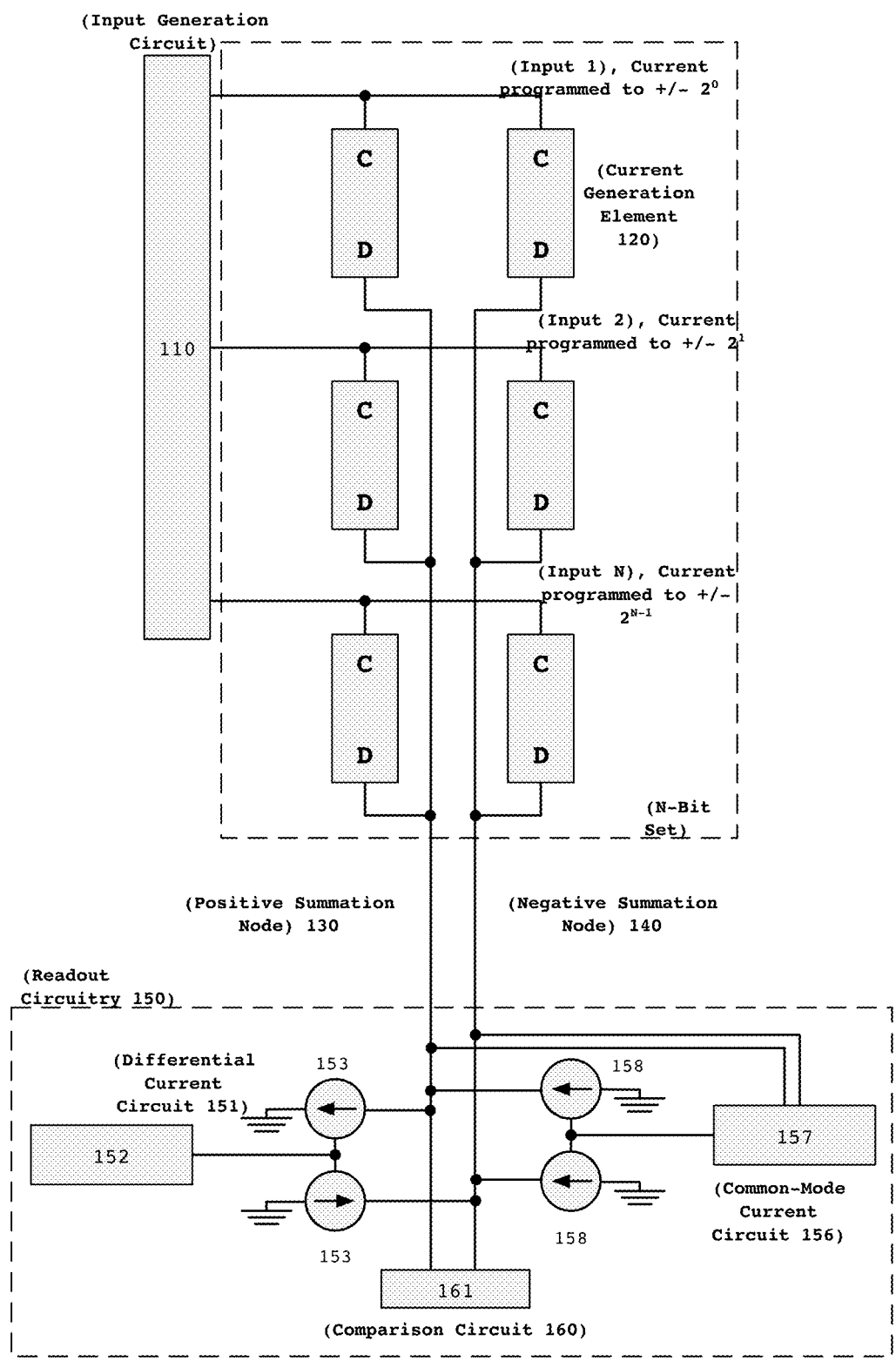
FIG. 4 illustrates a third schematic architecture of an integrated circuit in accordance with one or more embodiments of the present application.
Figure 5:
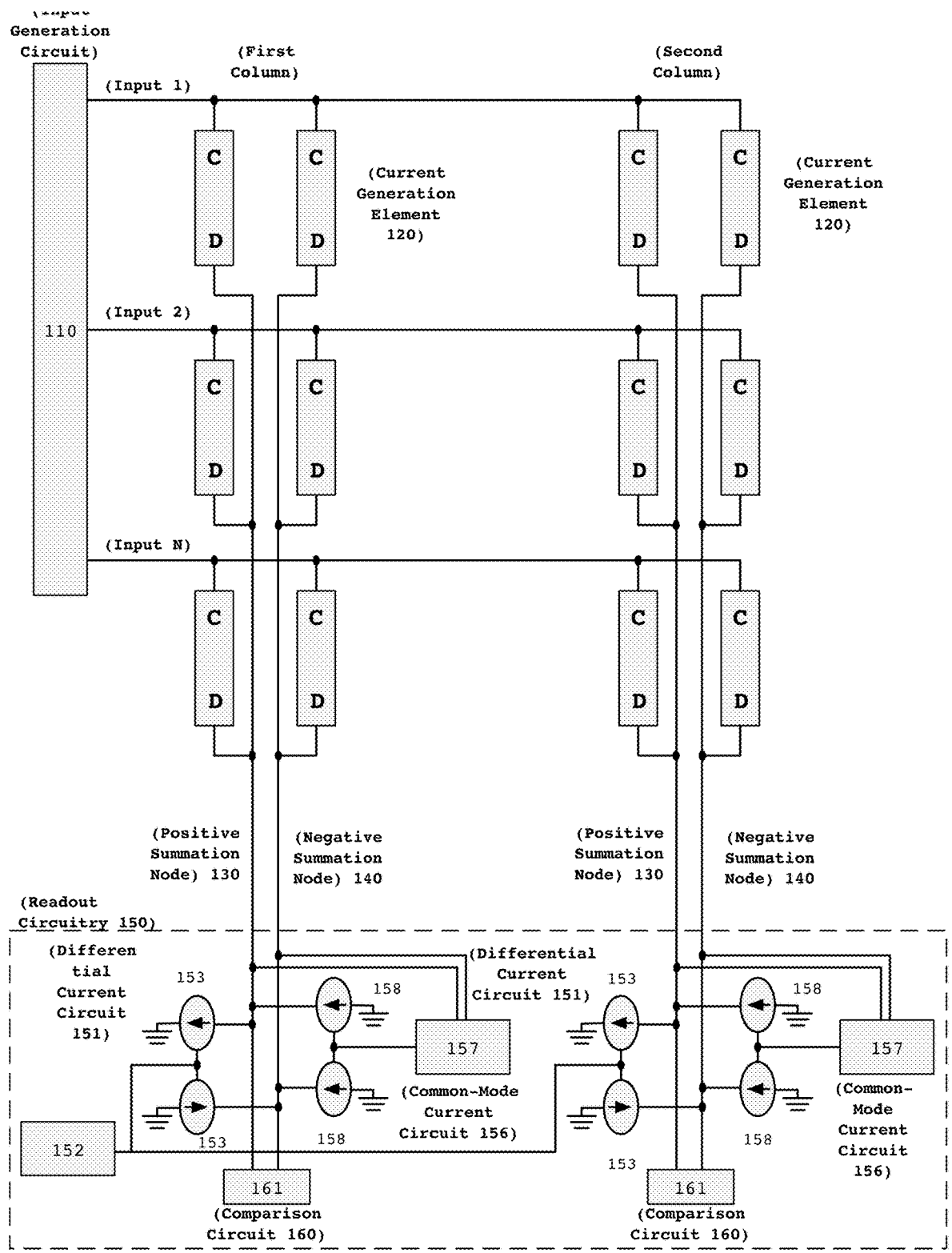
FIG. 5 illustrates a fourth schematic architecture of an integrated circuit in accordance with one or more embodiments of the present application.

In one implementation, the two or more arrays of programmable current sources 120 may be arranged in the circuit 100, as shown by way of example in FIG. 5. In this multi-column arrangement, each of the two or more arrays of programmable current sources 120 form columns that share the input generation circuit 110 and control logic 152 (e.g., microcontroller having a computer processor, processing circuit, or the like) of the differential current circuit 151, as shown by way of example in FIGS. 3-4. In this configuration, scale may be achieved in the circuit 100 because one or more components of the circuit 100 including the input generation circuit 110 and at least, the microcontroller of the differential current circuit 151 are not replicated.

Figure 6:
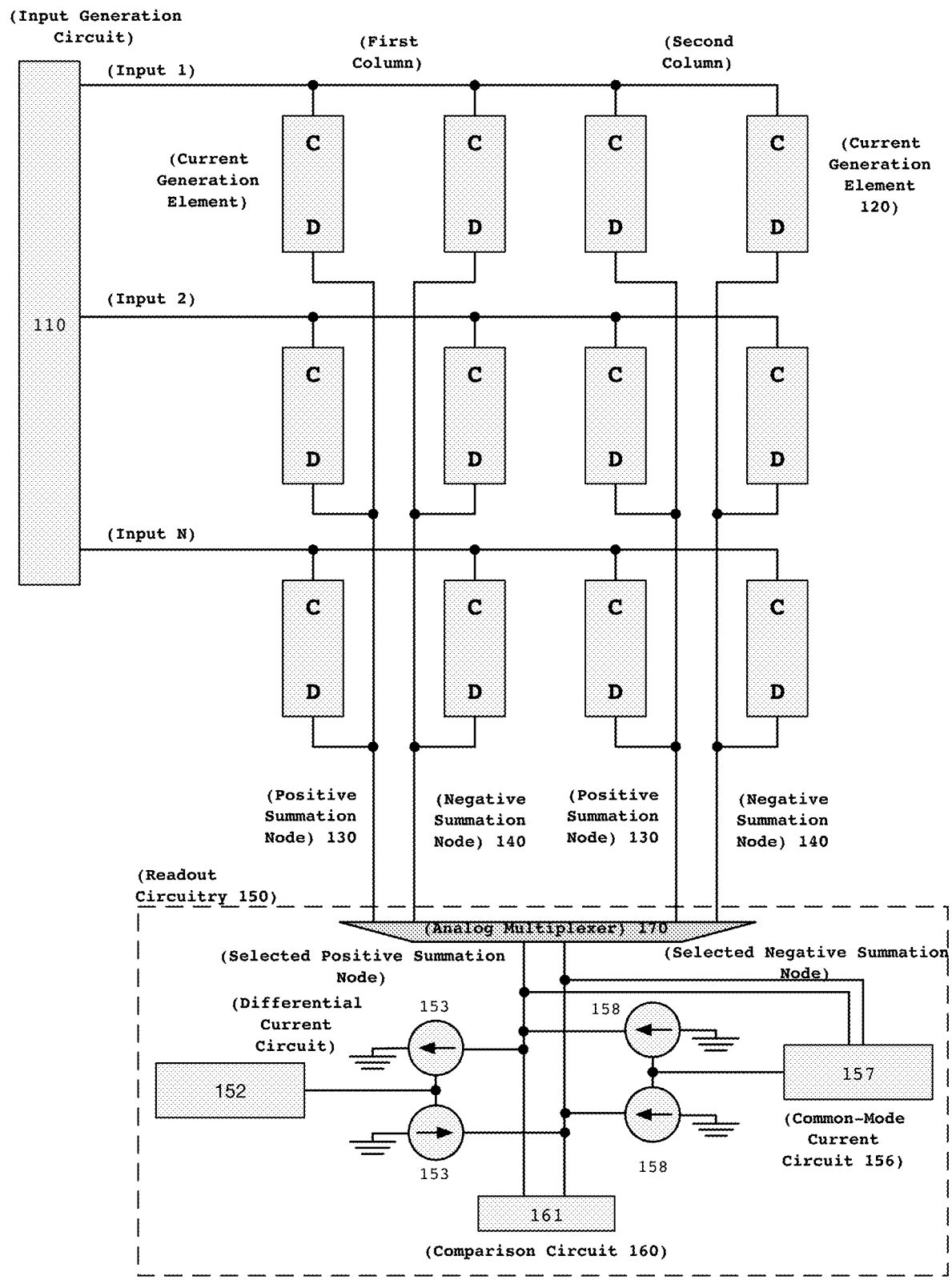
FIG. 6 illustrates a fifth schematic architecture of an integrated circuit in accordance with one or more embodiments of the present application.

In a second implementation in which two or more arrays of programmable current sources 120 may be arranged in the circuit 100, an analog multiplexer 170 may additionally be arranged within the circuit 100 to enable the multiple columns or arrays of programmable current sources 120 to share the differential current sources 153, the common-mode current circuit 156 and current sources 158, and the comparison circuitry 160, as shown by way of example in FIG. 6. Preferably, the analog multiplexer 170 functions to receive weighted summed currents from a first column or array of programmable current sources 120 and separately, from a second column or array of programmable current sources 120. In operation, the analog multiplexer 170 may function to alternate the weighted summed currents from each column or array of programmable current sources into the readout circuit 150. In this way, the functionality of the analog-to-digital converter of the readout circuit 150 may be amortized over multiple columns. While this implementation is illustrated with two columns or arrays of programmable current sources 120, it shall be understood that the analog multiplexer may be scaled for implementing any number of columns or arrays of programmable current sources 120.

In a variant of the second implementation, output states for each of multiple columns of programmable current sources 120 may be connected together in a shift chain such that the output results from each column of programmable current sources 120 may be shifted out from the shift chain at the end of a weighted sum calculation performed in circuit 100. This enables efficiencies in circuitry area of the circuit 100 in the case there is not sufficient space to position output circuitry for each of the multiple columns of programmable current sources 120 implemented in the circuit 100.

The first summation node 130 and the second summation node 140 may include any type of conduit capable of transmitting or carrying an electrical charge. For instance, the first summation node 130 and the second summation node 140 may include an electrical conductor (e.g., a metal wire or trace, conductive fluids, etc.). It shall be noted that any suitable electrical conduit may be used for implementing the first and the second summation nodes 130, 140.

Each of the plurality of programmable current sources 120 preferably functions to generate a current value in response to an (analog) input signal (e.g., a voltage, etc.). In a preferred embodiment, a programmable current source 120 comprises a resistive circuit that functions to generate a current value when a voltage is applied. The resistive circuit may be any type of reconfigurable resistor (i.e., a tunable resistor) and preferably, the resistive circuit comprises NOR-flash transistors that may be programmed to store any suitable or reconfigurable resistive value or coefficient. Additionally, or alternatively, the resistive circuit comprises a resistive random-access memory (RRAM or ReRAM) that is a type of non-volatile random-access computer memory that operates to change a resistance across a dielectric solid-state material, which may also be referred to as a memristor. In some embodiments, the programmable current sources 120 may be implemented using one-terminal (1T) or two-terminal (2T) NOR-flash transistors and/or other flash memory. It shall be understood that the programmable current sources may be implemented by a variety of current generation devices including other types of NOR- and NAND-flash devices, RRAM devices, or any suitable device known in the art.

In a preferred embodiment, the programmable current sources 120 may be preconfigured with a weight or a coefficient. For instance, weights and/or coefficients of a machine learning model (e.g., a neural network model) may be mapped to pairs of the programmable current sources 120.

As mentioned previously, the programmable current sources 120 are preferably arranged into pairs and programmed in advance (i.e., preprogrammed) such that when a same input voltage signal is applied across the pair of programmable current sources 120, the pair of programmable current sources 120 output a pair of currents (a current output by each respective current source of the pair) having a difference that is programmed to be a specific or predetermined value. Accordingly, the difference between the respective currents sourced by the pair of programmable current sources 120 may be generated by programming the programmable current source arranged in electrical communication with the (positive) summation node 130 to a predetermined value (e.g., a positive weight or positive coefficient) and/or programming the programmable current source arranged in electrical communication with the (negative) summation node 140 to a predetermined value (e.g., a positive weight or positive coefficient). Accordingly, the output of the pair of currents by the programmable current sources 120 having a predetermined difference value may be achieved when the input circuit 100 provides an input signal comprising a voltage input to the pair of programmable current sources 120 during a condition that two summation nodes are each at a target voltage ($V_{TARGET}$). Further, as described in more detail below, the readout circuit 150 may function to create the target voltage condition of the two summation nodes and while creating this condition, the readout circuit 150 may also function to determine the summed difference in current of the programmable current sources 120. Accordingly, a weighted sum calculation result may be determined in this manner by determining the summed current difference for a given set of inputs.

The readout circuit 150 preferably functions to determine, from a weighted sum current signal, a digital output signal or code. The readout circuit 150 preferably includes a differential current circuit 151, a common-mode current circuit 156, and a comparator circuit 160 operating in concert to determine a weighted sum calculation result for a given set of inputs.

In one or more embodiments of the present application, the readout circuit 150 preferably comprises an analog-to-digital converter (ADC). Due to yield issues often arising from fabrication defects, the integrated circuit 100 may be implemented with redundant ADCs to account for failure. In one or more specific implementations, column redundancy may be implemented enabling a replacement of an entire ADC in case of failure. It shall be noted that column and/or row redundancies may be implemented.

Further, in such embodiments, a number of redundant ADCs (X) may be deployed for each set of N ADCs in an integrated circuit. In use or operation, outputs of the redundant ADCs may be multiplexed into all N ADC outputs in a given set. This architecture allows for a transparent design that does not add extra parasitics to sensitive analog nodes. In a variant implementation, each defective or corrupt ADC may be shifted by one when a redundant ADC is required. In this way, there is less routing but may require that the digital fabric be aware of the redundancy implementation. For instance, after chip bring up, bad ADC locations are stored in fuses or the like and redundant ADCs are set to replace the defective ADCs.

The differential current circuit 151 preferably includes current sources 153 and a differential microcontroller circuit 152 for controlling current generating currents using the current sources 153. The differential current circuit 151 preferably functions to generate and supply differential current values to each of the first and second current summation nodes 130, 140. In use, the differential current circuit 151 and the associated current sources 153 may function to generate two currents at a time with a known difference and sources one current to each of the first and second summation nodes 130, 140. Preferably, the two differential currents produced by the current sources of the differential current circuit may be equal in magnitude but have opposite signs (e.g., one positive current, one negative current of a same magnitude, [50 A, −50 A]). Additionally, or alternatively, the two differential currents produced by the two current sources 153 of the differential current circuit 151 may vary in magnitude such that a first current signal and a second current signal supplied by the two current sources 153 based on input signals from the differential current circuit 151 may have different magnitudes (e.g., [+8 A, +2 A], [+4 A, +6 A], or the like).

Each of the two differential current sources 153 of the differential current circuit 151 may be in electrical communication with one of the first current summation node 130 and the second current summation node 140. In some embodiments, each the two differential current sources 153 share a direct electrical connection with one of the first current summation node 130 and the second current summation node 140, such that a terminal of each of the two current sources is electrically connected or electrically coupled to one of the first and the second current summation nodes 130, 140.

In one implementation, the differential circuit 151 comprises a digital-to-analog converter (DAC) having current mirrors acting as a controller and that is preprogrammed with or have access to a set of known digital input values or codes. The DAC preferably functions to vary the differential current signals supplied by the two current sources 153 by converting the known or pre-set digital input values to analog signals (e.g., the differential current signals). The current mirrors may function to duplicate a first current through one active device (or current source) by controlling the current in another active device while keeping the output current constant irrespective of loading. In a preferred embodiment, the circuits defining the current mirrors include an inverting current amplifier or the like that functions to reverse a current direction.

In use, the DAC with current mirrors may function to ramp or sweep through the set of known digital values as input into the DAC and output resultant (and varying) current signals that may be added to each of the first and second summation nodes 130, 140. In a preferred embodiment, the DAC may ramp or sweep from the most negative known digital value to the most positive known digital value. Additionally, or alternatively, the DAC may sweep from a most positive known digital value to a most negative known digital value. While some of these embodiments may implement a differential current circuit comprising a DAC with current mirrors or the like to generate two differential currents, it shall be understood that any suitable and/or known device for generating differential currents may be implemented.

The common-mode current circuit 156 preferably comprises two current sources 158, a common-mode control circuit 157 (e.g., a microcontroller having a computer processor, a processing circuit, or the like) an amplifier, and a common-source amplifier stage, as shown by way of example in FIG. 1. The common-mode current circuit preferably functions to measure via a measuring circuit (which may sense voltage, current, or any electrical parameter or charge) an average voltage of the first and second summation nodes 130, 140. Responsively, the common-mode control circuit 157 may function to modulate the current sources 158 to output a current signal to each of the first and the second summation nodes 130, 140 so that the average voltage of the first and second summation nodes 130, 140 is equal to or substantially equal to a target voltage ($V_{TARGET}$). In a preferred embodiment, the current signals generated or sourced by the two current sources 158 and output to each respective summation node 130, 140 are equal in magnitude and sign.

Figure 3A:
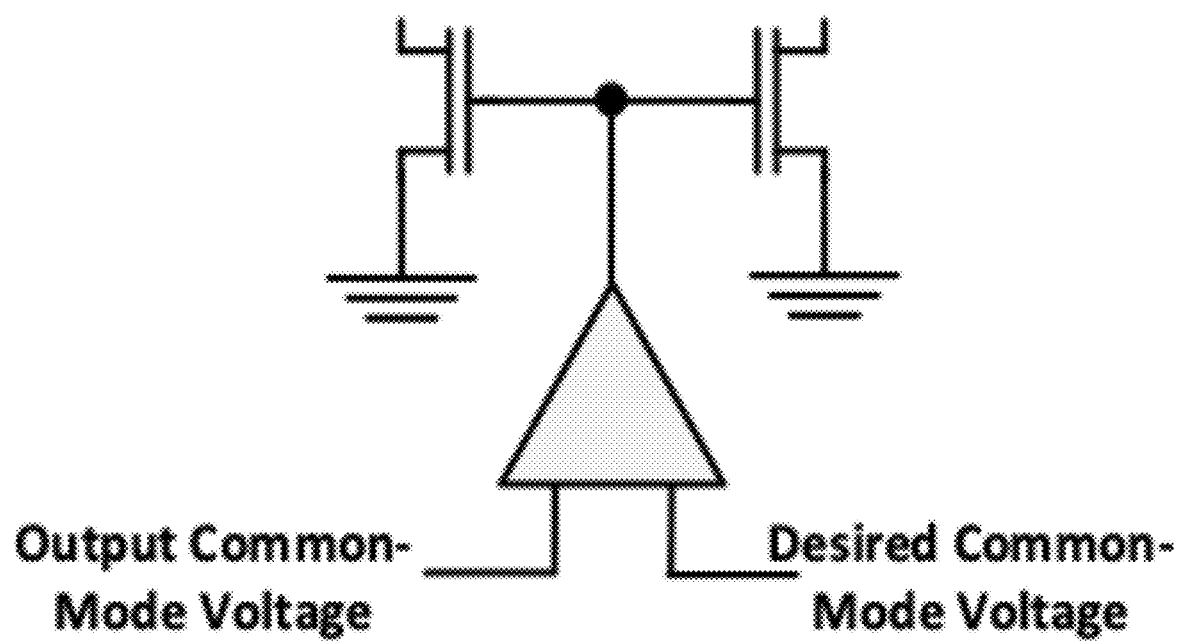
FIGS. 3A-3E illustrate schematics of variant architectures for implementing a common-mode circuit in accordance with one or more embodiments of the present application.

As shown in FIG. 3A, in one implementation, the common-mode control circuit 157 may be implemented with an amplifier A to drive a voltage gate of transistors of the circuit 157 until the inputs at each of the first and the second summation nodes 130, 140 are equal to a desired common-mode voltage ($V_{TARGET}$). It shall be noted that the transistors of the common-mode control circuit 157 may be implemented with one or more NMOS transistors, PMOS transistors, and/or any suitable or known transistor.

Figure 3B:
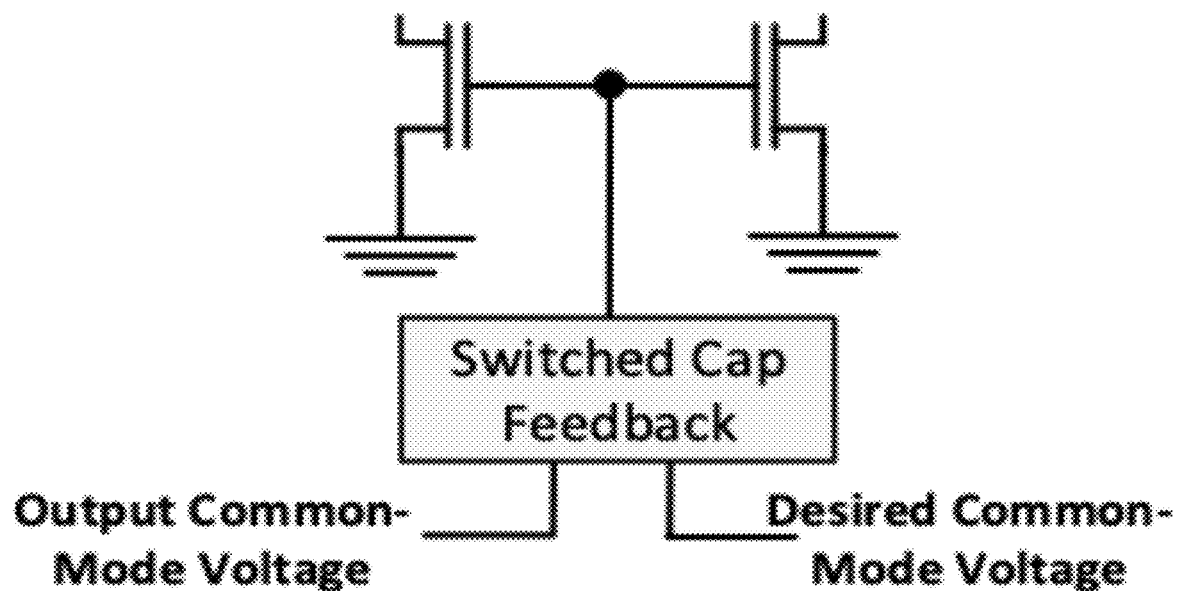

Additionally, or alternatively, as shown in FIG. 3B, the common-mode control circuit 157 may be implemented with a switched capacitor feedback network to modulate the gate voltage of the transistors of the circuit 157.

Figure 3C:
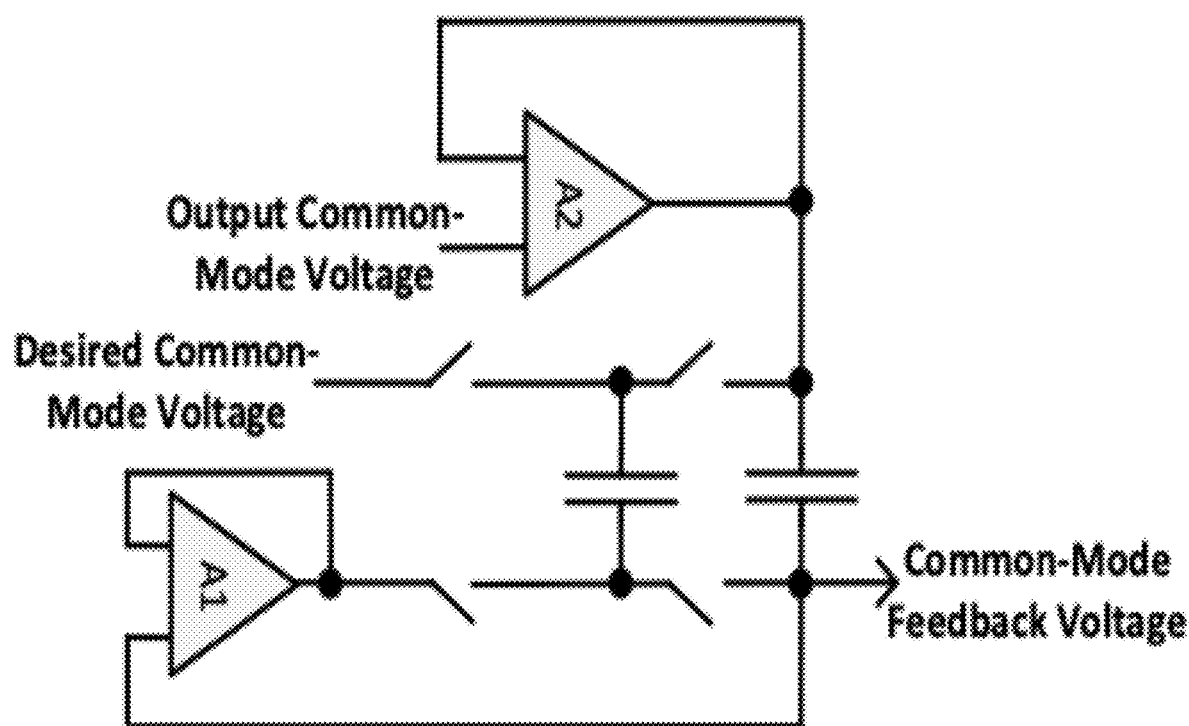

In a preferred implementation in which the common-mode control circuit 157 includes a switched capacitor feedback network, the switched capacitor feedback network may be constructed with an architecture that shields sensitive output voltages from switching signals in the common-mode control circuit 157 that cause disturbances on the output voltage nodes. Also, because the common-mode feedback voltage may require a large swing to cover a full range of common-mode currents generated by the programmable current sources (e.g., flash cells, etc.), an effective gain of the switched capacitor feedback circuit should be higher than in normal circumstances. As shown by way of example in FIG. 3C, the switched capacitor feedback network may preferably be implemented with amplifier A1 that drives an ideal voltage (target voltage) to track the generated common-mode feedback voltage, thereby changing the ideal voltage setting with the common-mode current value. Additionally, an amplifier A2 may be provided that shields the sensitive output voltages from the switching signals in the common-mode feedback circuit.

Due to imperfect circuit components and/or one or more side effects within a circuit design of circuit 100, compensation circuitry and/or compensation methods may be implemented within the circuit 100 to mitigate side effects or other unintended issues in the design of circuit 100. As one example, offset between the common-mode current driving transistors may function to cause an offset in current through programmable current sources 120 thereby corrupting the input signal from the input circuit 110. Accordingly, in advance of implementing the circuit 100, the common-mode circuit 156 may be calibrated to compensate for the offset in current (i.e., the offset in current is calibrated out).

For instance, in one or more implementations, the common-mode control circuit 157 may additionally or alternatively include circuity for common-mode dependent offset. As discussed above, the transistors used to adjust the common-mode output voltage may have some parameter mismatches after fabrication thereby causing different transconductance values between the two devices even when given the same input voltage from the common-mode feedback circuity, the two transistors may generate different current values. This difference in current values or current error may manifest as a differential voltage on the output of the ADC amplifier (e.g., the front-end ADC amplifier), resulting in an offset in the ADC. Accordingly, because common-mode current changes, this transistor device error may cause greater or lesser effective current error depending on which common-mode current case is being calculated. In one or more embodiments of the present application, the offset or transistor device error may be corrected by modulating the gate voltages of two current steering transistors with one shared common-mode adjusting transistor.

Figure 3D:
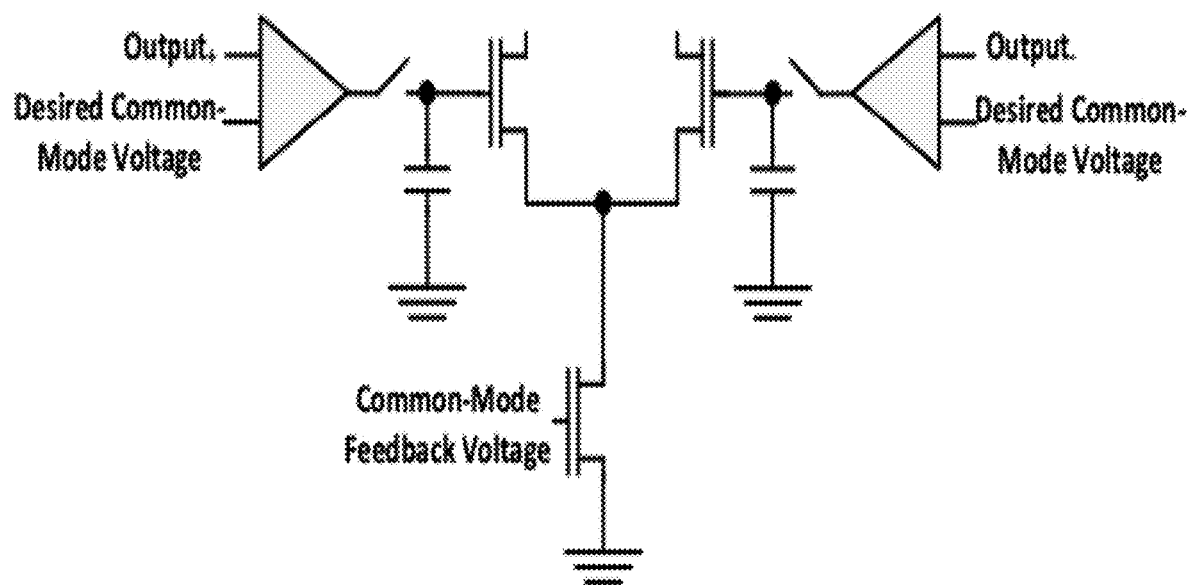

In a first implementation, as shown by way of example in FIG. 3D, two amplifiers may be provided to drive gate voltages of (NMOS) transistors to values that satisfy the output equal to the desired common-mode voltage when the circuit 157 is in a known operating condition. In a variant of this first implementation, the common-mode control circuit 157 may be implemented with only a single amplifier that may be switched between the two transistors to generate the voltage values that matches the common-mode target voltage in two phases of operation.

Figure 3E:
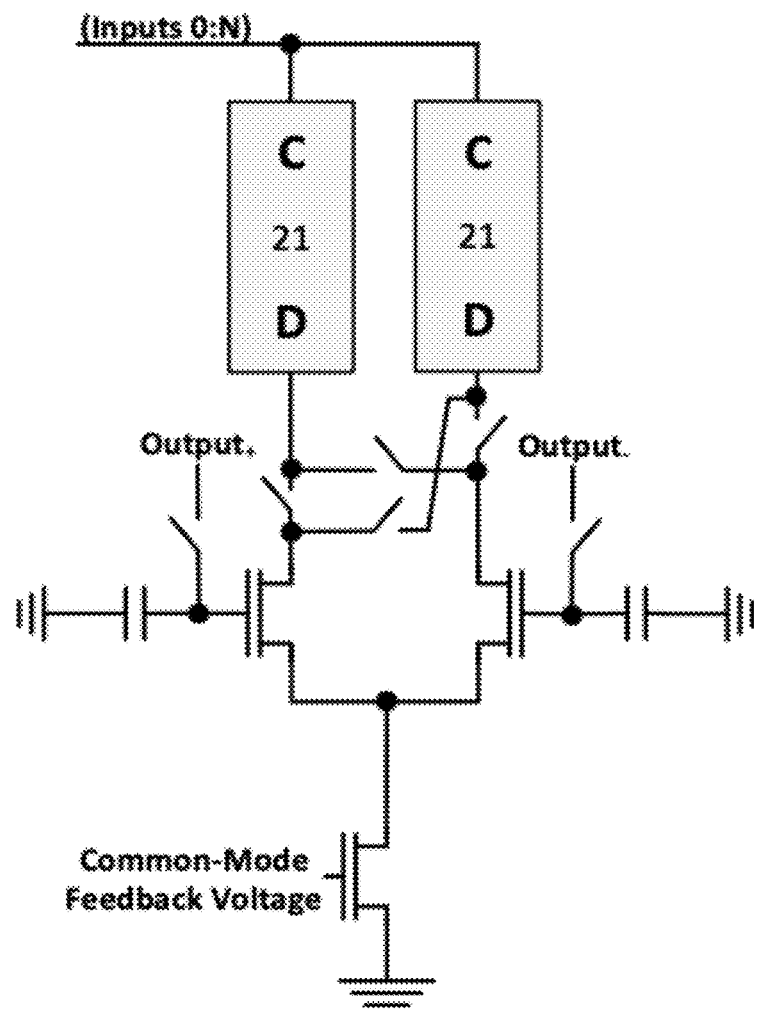

As shown by way of example in FIG. 3E, in a second implementation, an amplifier at a front-end of the ADC may be auto-zeroed, where the output voltages are shorted to the capacitive input nodes, and the voltage differentials are stored as gate voltages on the two (NMOS) transistors. Accordingly, to avoid correcting for differential current values generated by the flash cells, the inputs are inverted during an offset correction (i.e., auto-zeroing) phase and subsequently the inputs are un-inverted a calculation (i.e., a non-auto-zeroing) phase. This two-phase process may function to preserve the signal from being corrected and doubles the signal by storing the inverted value on the gates of the (NMOS) current steering transistors.

Preferably, in a first phase of compensation calibration, a selected set of programmable current sources 120 may be electrically connected to the first summation node 130 (e.g., the positive summation node). In this implementation, an amplifier of the common-mode circuit 156 functions to drive a first capacitor referenced to a voltage reference ($V_{ref}$) so that the first summation node 130 is equal to or substantially equal to a target voltage ($V_{target}$). In this phase, $V_{ref}$ is selected for enabling good operating conditions of the amplifier of the common-mode circuit 156 and may represent a nominal value needed on the gate of the P-type metal-oxide-semiconductor (PMOS) devices (e.g., transistors) to achieve $V_{target}$ without offset. Consequently, the amplifier of the common-mode current circuit 156 drives a voltage across the first capacitor that represents the offset of that transistor from an ideal state.

In a second phase, the selected set of programmable current sources 120 (i.e., the same set) of programmable current sources 120 (having identical current signals) may be connected to the second summation node 140 (e.g., the negative summation node). The amplifier of the common-mode current circuit 156 may function to drive a second capacitor that may also be referenced to the voltage reference ($V_{ref}$) so that the second summation node 140 is equal to or substantially equal to a target voltage ($V_{target}$).

As result of the first phase and the second phase of compensation calibration, a difference in voltage between the first and the second capacitor may represent the difference in offset current (e.g., compensation current) generated by the two PMOS devices. It shall be noted that the compensation calibration may implement any of the set of programmable current sources 120 between the first and the second phase of calibration and may function to operate on either the first summation node 130 or the negative summation node 140 in the first or second phase. It shall also be noted that the implemented transistors in the circuit 100 may be n-channel metal-oxide-semiconductor field effect (NMOS) while the transistors of the common-mode circuit 156 may be PMOS, the arrangement of the NMOS transistors and the PMOS transistors may be flipped or switch, such that the common-mode circuit 156 implements NMOS transistors and PMOS transistors may be implemented elsewhere including with the differential current circuit 151.

In operation, the amplifier of the common-mode circuit 156 may function to drive a bottom plate of the difference-storing capacitors such that the common-mode current driving sources 158 each receive a voltage modified by its corresponding stored offset.

The first and the second summation nodes 130, 140 preferably have two sources of differential currents including the summed programmable current sources 120 and the differential current circuit 151. In operation, when the two sources of differential currents are equal but opposite, they will cancel, and the result will be no total differential current. When this condition of zero differential current is met, the common-mode current circuit 156 and the two current sources 158 will make the first and the second summation nodes 130, 140 to be equal to $V_{TARGET}$, thereby enabling the condition that all differential currents are known by being in the correct voltage condition.

The readout circuit 150 preferably functions to identify or determine an equal-but-opposite current condition between the two sources of differential currents by changing the differential current generated by the current sources 153 and reading an output of the comparison circuit 160. When differences between the two sources of differential currents are not equal, one summation node of the two summation nodes 130, 140 will have a determined voltage that is greater than a determined voltage of the other summation node and the comparison circuit 160 will maintain or generate a first output indicating which summation node is greater in voltage. The node having the higher voltage value may depend on whether the differential current circuit 151 is sourcing more positive or more negative differential current than the sum of the programmable current sources 120. As described in some detail above, the differential current sourced by the differential current circuit 151 may be swept from a most negative value to a most positive value or conversely, a most positive value to a most negative value, and the comparison circuit 160 will change its output at the point that the two differences in current cross. That is, when the sum of the two differential current sources is equal to zero or the summed voltage values in both the first and the second summation nodes 130, 140 is equal to ($V_{TARGET}$), the comparison circuit 160 will change its output. At the time that the comparison circuit 160 changes its output, the differential current values sourced to the summation nodes by the differential current circuit may be recorded and referenced by an analog-to-digital converter to generate a digital output code representing the weighted sum difference of the two programmable current sources 120. Further, at that time, it is known that the recorded two differential current values sourced by the differential current circuit were equal in magnitude but opposite in direction with respect to the summation of the two differential currents of the first and second summation nodes 130, 140.

V. Mixed-Signal Compute Architecture Implementing an Array of DACs

Figure 7:
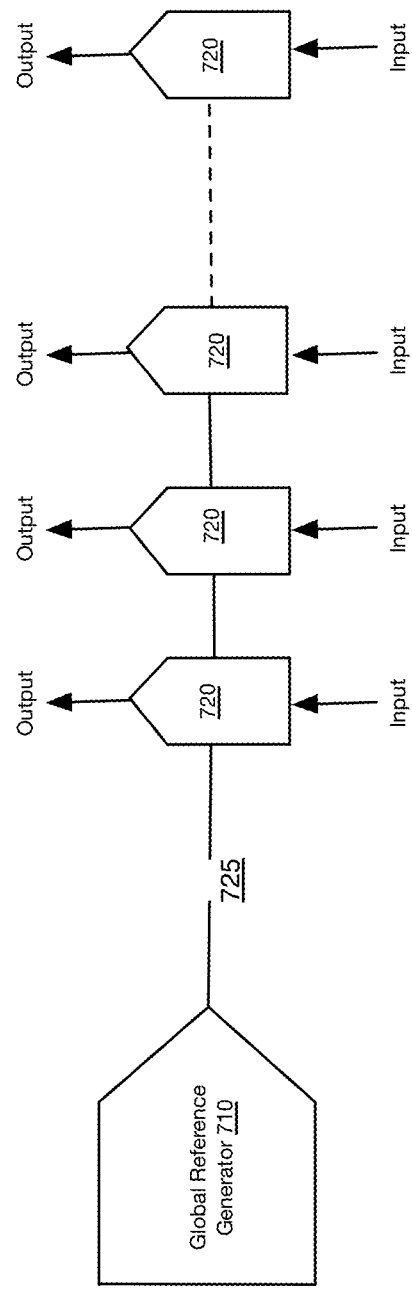
FIGS. 7-7C illustrate a schematic for implementing a global reference source with an array of local current sources within an integrated circuit in accordance with one or more embodiments of the present application.
Figure 7A:
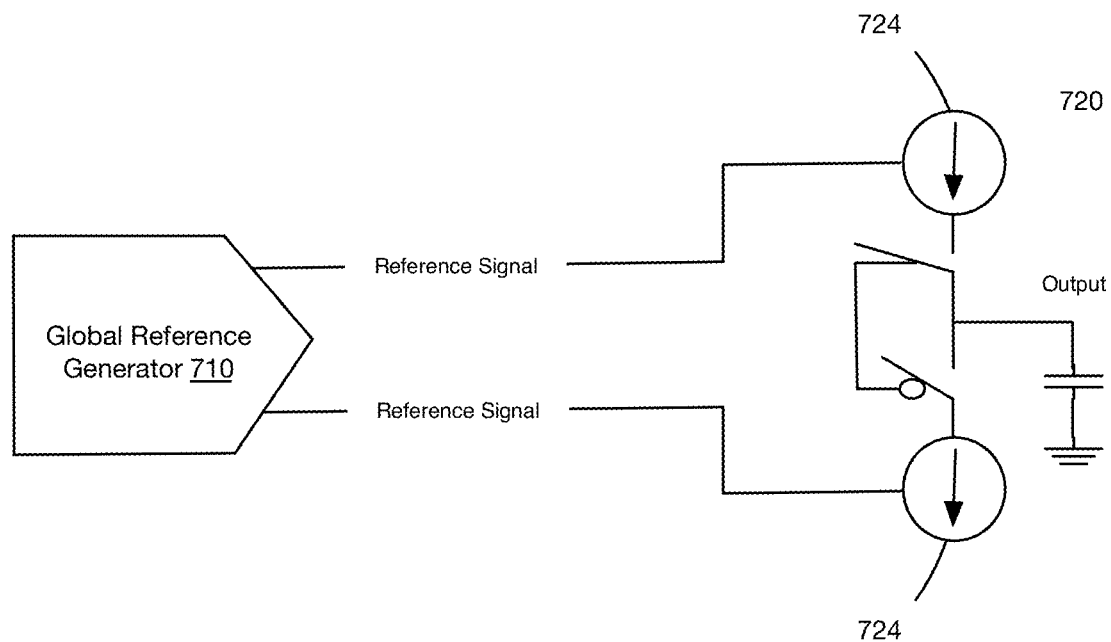

As shown in FIG. 7, a system 700 for implementing mixed-signal computing for computationally-intensive programs and/or applications includes a global reference generator 710, a plurality of local accumulators 720, and a shared signal path 725. As shown in FIG. 7A, the local accumulators 720 may each include an energy storage device 722, and current mirrors 724.

The system 700 preferably functions to bifurcate typical functionality of a digital-to-analog converter into at least two component devices. The first component, in several embodiments, includes the global reference generator 710 that functions to define or generate one or more (analog) reference signals. In some embodiments, the global reference generator 710 may comprise a binary-weighted global reference generator. The second component, in several embodiments, includes a set of local accumulating devices that function to receive, via a shared signal path 725, the reference signals from the global reference generator 710 and further function, in some embodiments, to perform some arithmetic function (e.g., addition, subtraction, etc.) of the values of the reference signals over a set period of time.

The system 700 functions to achieve scale and area efficiency (e.g., to make a smaller integrated circuit) with, at least, the above-described configuration by allowing the first component to be large and capable of generating accurate reference signals for the second component comprising the set of small, local accumulating devices. That is, the area and power of the first component (which would be matching, and noise limited) is now amortized. Therefore, the system 700 enables an integrated circuit architecture that is capable of performing computationally-intensive operations while having extremely high area and power efficiencies.

The global reference generator 710 functions to generate reference signals for each of a plurality of local accumulators 720. Preferably the global reference generator 710 comprises a global digital-to-analog converter (DAC), as shown in FIGS. 7-7A. In such case, the global DAC may function to receive, as inputs, digital signals (e.g., binary number or input) from an external source and function to output analog reference signals (e.g., a voltage or current signal) to a plurality of local DACs. Accordingly, the global DAC may function to generate analog reference signals to the local accumulators (e.g., local DACs) based on digital input received at the global DAC. Additionally, or alternatively, the reference signal generated and transmitted by the global reference generator 710 to each of the local accumulators may be an analog reference signal, such as a current or voltage, that may be used to control or drive functionality of the local accumulators 720. Accordingly, the global reference signals provided by the global reference generator 710 are preferably transmitted to the local accumulators 720 via a shared signal path 725 (e.g., a shared or common wire) that operably connects the local accumulators 720 to each other as well as to a same global reference generator 710.

Figure 7B:
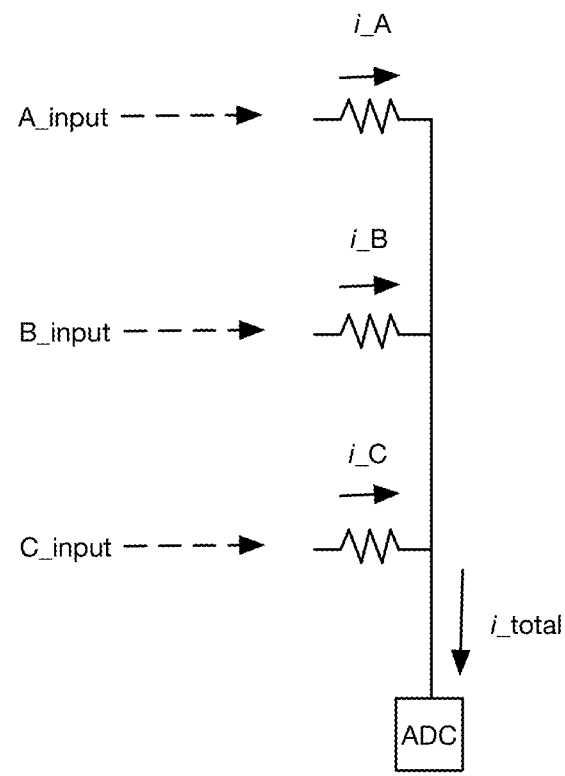

With respect to FIG. 7B, FIG. 7B illustrates one implementation of the global DAC-to-local DACs architecture in which a plurality of local DACs (LDACs) function to receive one or more analog reference signals from a single global DAC (GDAC). Accordingly, local input (e.g., A_input, B_input, etc.) being received at each local DAC may be applied against a tunable resistor that generates an amount of current charge. Accordingly, in some embodiments, each column of tunable resistors may function as a neuron (of a neural network) in combination, the current output generated at each tunable resistor in a neuron column may be aggregated to form a single, aggregate current output (e.g., neuron output). It shall be noted, however, that the columns of tunable resistors may be applied in any suitable computing technique or computing architecture.

Figure 7C:
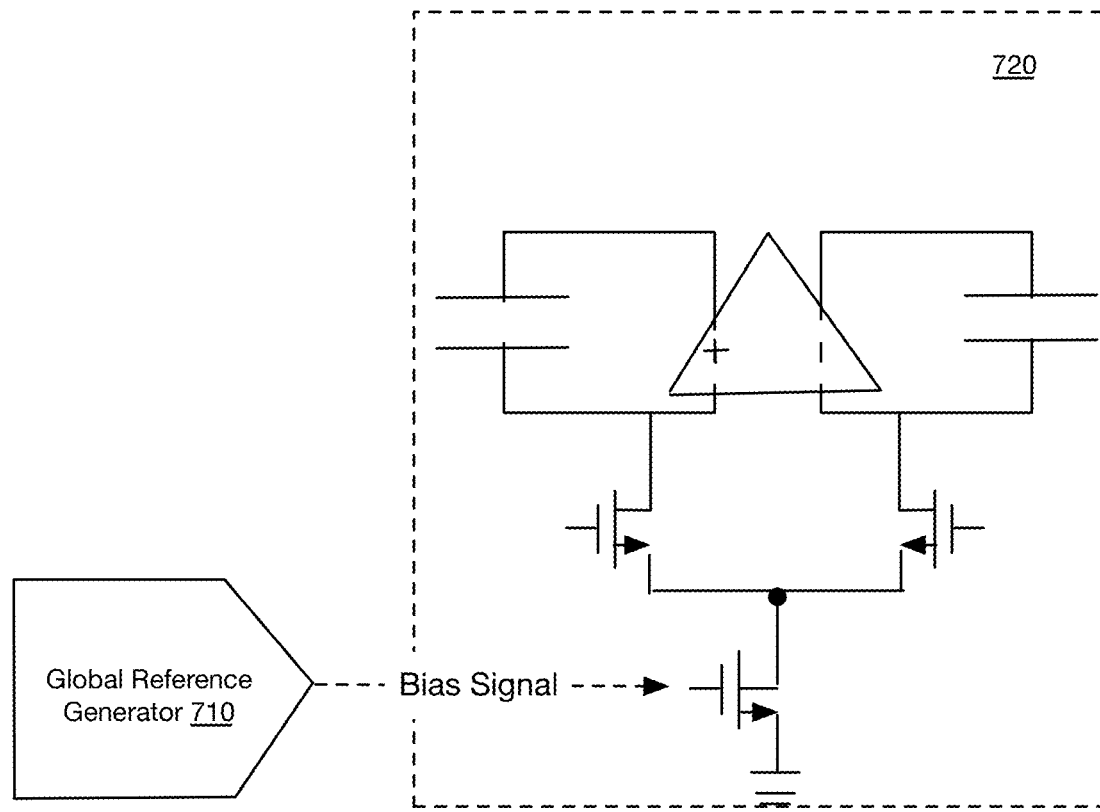

Referring to FIG. 7C, another implementation of a local accumulator 720 is illustrated in which the global reference generator 710 functions to generate bias voltages bias voltages (e.g., global reference signals) for an amplifier-based integrator of the local accumulator 720. A technical advantage of such implementation includes enabling the local accumulator 720 with a single current source (rather than two current sources). In a preferred configuration of the local accumulator 720 with an amplifier-based integrator, a dummy path may be implemented that reduces an effect of charge injection, which occurs when (transistor) switches actuate to an ON or OFF state. Such a configuration may be achieved with an additional transistors.

Generally, the global reference generator 710 may be configured with a high-speed analog design with better matching and noise performance. Additionally, or alternatively, the configuration of the global reference generator 710 may include reference signal generation devices and/or circuitry that allows the global reference generator 710 to generate analog reference signals and also, causes the global reference generator 710 to be large relative to each of the plurality of local accumulators 720. Additionally, or alternatively, the global reference generator 710 may be configured to transmit reference signals sequentially (e.g., one at a time) or simultaneously (e.g., multiple signals per clock cycle). It shall be noted that the global reference generator 710 may be configured to generate and/or transmit reference signals in any suitable manner contemplated herein or otherwise known in the art.

The shared signal path 725 may be a single signal wire, signal trace, or signal path with multiple connections to the plurality of local accumulators 720. The shared signal path preferably functions to allow a transmission of reference signals from the global reference generator 710 to each of the plurality of local accumulators 720 that are connected thereto or positioned along the shared signal path 725. The shared signal path 725 may be configured such that any reference signal originating from the global reference generator 710 being transmitted along the shared signal path 725 may be copied or otherwise, mirrored by each of the local accumulators 720 connected to the shared signal path 725.

In one implementation, the shared signal path 725 may be used by the global reference generator 710 to provide serialized (analog) reference signals. Accordingly, in such implementation, the shared signal path 725 may function to provide single bit reference signals every clock cycle to the local accumulators 720. For instance, if the global reference generator 710 comprises a three-bit DAC or the like, the shared signal path 725 may provide each of the three bits individually and sequentially to each of the plurality of local accumulators 720. In this way, the shared signal path 725 enables a single signal source (e.g., the global reference generator) to provide accurate reference signals to multiple local accumulators in lieu of a dedicated signal source for each of the local accumulators 720. A technical benefit of such configuration is considerably smaller circuitry for implementing computationally-intensive applications and/or programs (e.g., neural network models, etc.).

The local accumulators 720 may function to generate an analog output to a local output receiver (e.g., local analog-to-digital converter) or the like. In a preferred embodiment, the plurality of local accumulators 720 comprise a plurality of local digital-to-analog converters (LDACs) that may function to generate the analog output over several clock cycles using the global reference signals from the global reference generator 710. It shall be noted that depending on the reference signal generation mode of the global reference generator 710, the plurality of local accumulators 720 may generate the analog output over a single clock cycle. The configuration of the LDACs may generally exclude reference signal generation devices, as the reference signals for each of the LDACs may be provided by the global reference generator 710 and in general, the reference signal generation devices and/or circuitry are large.

It shall be noted that, in some embodiments, each of the plurality of LDACs may include one or more types of reference signal accumulation/aggregation/summation/reconstruction circuitry that function to output a resultant reference signal, as discussed in more detail below. That is, while in some embodiments, the local accumulators 720 (or LDACs) may function to accumulate reference signals, it is also possible in some variations for the local accumulators to increment/decrement an energy storage device or perform summation functions based on the encoding scheme of the global reference generator 710 and the configuration of each respective local accumulator.

As mentioned above, each of the plurality of local accumulators 720 may include an energy storage device, current mirrors 724, and in some embodiments, comparator circuitry. The energy storage device preferably functions to store locally at the local accumulator 720 energy values, such as analog energy values including current or voltage values. Preferably the energy storage device comprises a capacitor, however, the energy storage device may be any suitable electrical energy storing element, such as a flash transistor operating in series or the like. In some embodiments, each of the plurality of local accumulators 720 may function to perform arithmetic functions against the energy storage device based on one or more signal inputs (e.g., sequential inputs). Accordingly, a local accumulator 720 may function to add and/or subtract charge on the energy storage device. Each local accumulator 720 may, additionally or alternatively, function to integrate a (voltage) charge on the capacitor based on one or more signal inputs.

The current mirrors 724 of each of the plurality of local accumulators 720 function to duplicate or copy a reference current signal provided through the shared signal path 725. Specifically, in some embodiments, the global reference generator 710 functions to provide a reference current signal via the shared signal path 725. The reference current signal may be received by each of the local accumulators 720 connected to or positioned along the shared signal path 725. Accordingly, using the current mirrors 724 at each respective local accumulator 720, the local accumulator 720 functions to copy the reference current signal (e.g., the global reference signal) for purposes of generating or accumulating an output signal.

In a preferred embodiment, the current mirrors 724 comprise circuits designed to copy a current through one active device by controlling the current in another active device of a circuit while keeping the output current constant irrespective of loading. The current mirrors 724 may function to copy a varying signal current or a constant signal current (depending on whether the global reference generator 710 provides a constant or varying global reference signal) and provide bias currents and/or active loads to circuits. Preferably, the circuits defining the current mirrors 724 include an inverting current amplifier (ideally) that, in most embodiments, functions to reverse a current direction as well or may be a current-controlled current source. However, it shall be noted that the current mirrors may include any suitable circuitry for copying a reference current signal.

Referring to FIG. 7A, one implementation of a local accumulator 720 is illustrated in which the global reference generator 710 functions to generate bias voltages (e.g., global reference signals) for two current mirrors 724 in the local accumulator 720. The bias voltages provided by the global reference generator 710 may be generated such that the currents copied in the current mirrors 724 are weighted. For instance, in a binary implementation of the global reference generator 710 of system 100, bias voltages generated by the global reference generator 710 may be updated every clock cycle. In this way, the copied current in the current mirrors 724 changes in a binary fashion. In this implementation, a sequential input or the like may be added in some charge on the energy storage device 722 (capacitor) of the local accumulator 720 or some charged subtracted from the energy storage device 722. The amount of charge that is added to or subtracted from the energy storage device 722 is preferably a function of the copied current in the local accumulator 720—since the copied current changes in a binary fashion, the charge added or subtracted functions to change in a similar or same manner. Accordingly, for an N-bit (e.g., 8-bit) global DAC or the like, N (e.g., N=8) clock cycles would be required to create a required output at the local DAC.

VI. Binary-Weighted Global Reference Source

Figure 8:
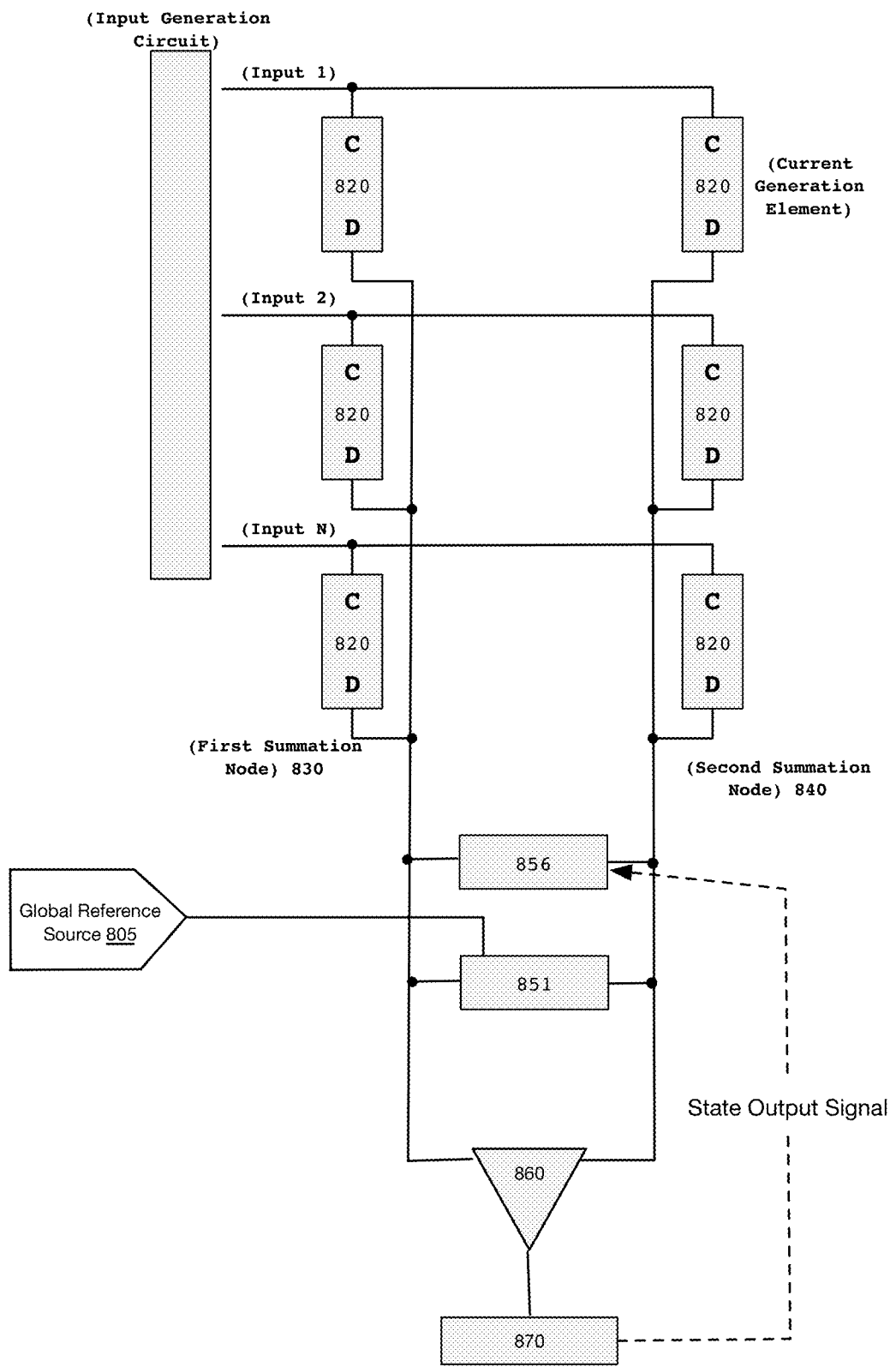
FIGS. 8-8A illustrate a schematic of a binary-weighted implementation of a global reference source within an integrated circuit in accordance with one or more embodiments of the present application.
Figure 8A:
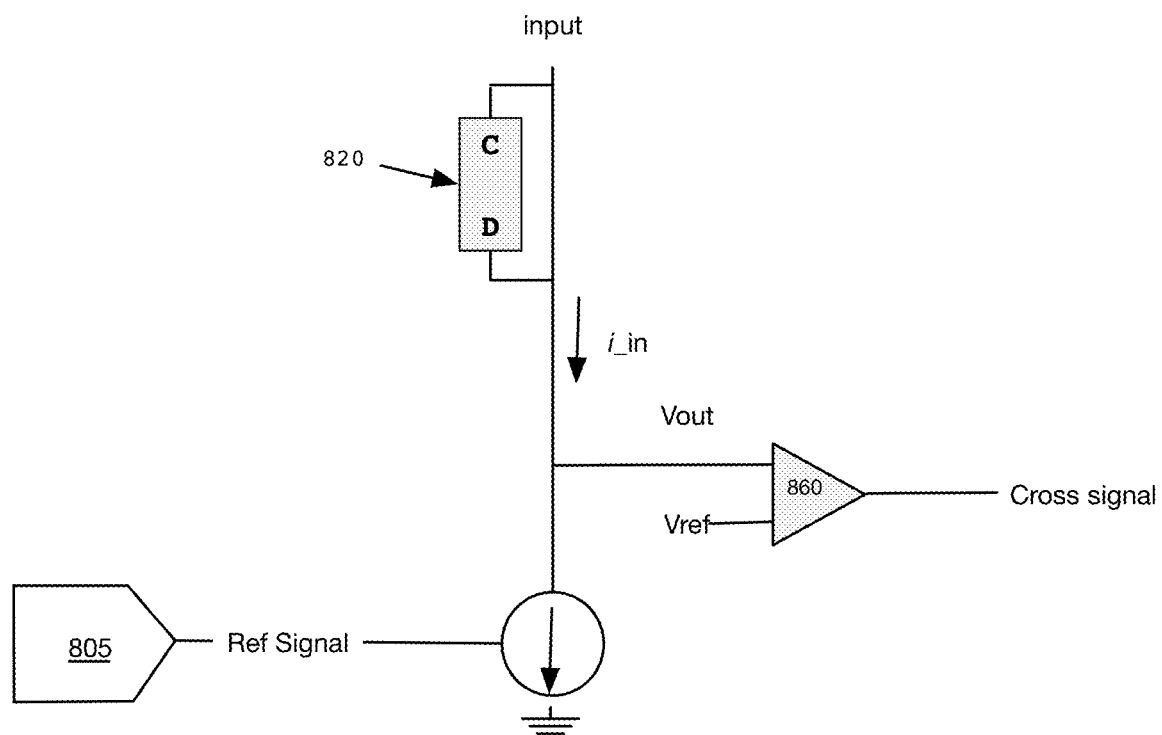

As shown in FIG. 8, an integrated circuit 800 implementing a binary-weighted global reference signal source 805, pairs of programmable current sources 820, a common mode current circuit 856, a local differential current source 851, a comparator 860, and a finite state machine 870. Each pair of programmable current sources 820 of the integrated circuit 800 preferably functions to set differential currents between a first summation node 830 and a second summation node 840. A common-mode current circuit 856 may be arranged with respect to the first summation node 830 and the second summation node 840 and functions to source current to or sink current from the first summation node 830 and the second summation node 840 to force or direct the pair of programmable current sources 820 to a known region of operation (e.g., an average reference voltage, etc.).

Additionally, each pair of programmable current sources 820 of the integrated circuit Boo is placed in electrical communication with a disparate local differential current source (e.g., a local digital-to-analog converter (LDAC)) that functions to adjust the differential current values between the first summation node 830 and the second summation node 840. Accordingly, multiple columns of paired programmable current sources may be arranged within the integrated circuit Boo defining an array and each column of paired programmable current sources may include a distinct and separate local differential current source 851. Therefore, a plurality of local differential current sources 851 may exist in the array wherein the plurality of local differential current sources are electrically coupled to a same global reference signal generator 805.

The local differential current source 851 preferably comprises a local DAC that functions to mirror reference signal values sourced by the global reference signal source 805. Additionally, each local DAC may include its own memory state that enables the local DAC to generate analog output signals according to values that may be pre-stored within the local DAC's memory. In operation, the global reference signal source 805 may function to execute a binary search algorithm such that at each step of the binary search algorithm, the global reference signal source sets a binary-weighted value with which each local DAC arranged within an array functions to adjust its local state and correspondingly, output differential current signals. Using the comparator 860, the integrated circuit may function to assess a relative state of the currents in each of the first and the second summation nodes 830, 840 to determine which node has a larger (or smaller) current signal. In response to the assessment, the local DAC may function to increase or decrease the current differential between the first and the second summation nodes 830, 840 using a progressively smaller increment based on the binary-weighted reference signal sourced from the global DAC. Accordingly, one comparison bit may be output to the local DAC after each differential current adjustment of the first and second summation nodes 830, 840 and after N cycles of receiving reference signals from the N-bit global DAC, a calculation of a matrix multiply output is completed.

In one variant, the integrated circuit Boo may be implemented as a single-end circuit with one programmable current source and one summation node. In such implementation, the common mode current circuit may be excluded from the architecture, as shown by way of example in FIG. 8A.

VII. Method for Implementing a Binary Matrix

As shown in FIG. 2, the method 200 includes receiving input signals S210, generating differential currents between a pair of summation nodes S220, adjusting the differential currents along the pair summation nodes to a known region of operation S230, sourcing or sinking differential currents to the pair of summation nodes S240, generating an output signal based on the differential current signals of the first and the second summation nodes S245, and identifying a weighted sum difference of the differential currents of the pair or a determinative output code S250.

S210, which includes receiving input signals, functions to enable a receipt of one or more input signals at the programmable current sources in response to a digital (e.g., binary) or an analog input. The one or more input signals may be sourced from one or more external devices (e.g., external sensor, etc.), an upstream local device, another circuit layer, and/or the like. In a preferred embodiment, the one or more input signals comprise a digital input signal or an analog input signal. In the case of receiving a digital input signal, S210 may function to implement an input circuit of a system implementing the method 200 to generate digital input signals with only an activated state associated with predetermined differential currents that are generated by the programmable current sources, or a deactivated state, where no differential current signals are generated by programmable current sources. That is, each digital or binary input signal may be associated with a single or finite associated analog current response, which also includes a value of zero for a current signal.

Additionally, or alternatively, in the case of receiving analog input signals into a system implementing the method 200, S210 may function to implement an input circuit to generate analog input signals with multiple activation states, which have multiple corresponding predetermined current signals, and a deactivated state, wherein no differential current is generated by the programmable current sources.

In the case that an analog input signal is received at one or more programmable current sources, S220 may function to apply the analog input signals across the programmable current sources to generate one or more current signals by each programmable current source. Preferably, a set of programmable current sources that are paired together may function to generate differential current signals in which the output current signals of the programmable current sources when summed together have a magnitude greater than zero.

In a preferred embodiment, the input circuit implemented in S210 comprises a voltage-controlled input circuit and therefore, the input signals received by each of the programmable current sources includes a voltage signal. Accordingly, when a voltage signal is applied across a tunable resistive element of the programmable current sources, resulting currents are generated. Preferably, each of the programmable current sources also include a pre-stored weight or coefficient which modifies a resistance strength of the resistive element of each programmable current source.

Additionally, or alternatively, in the case that a binary input signal is received at one or more of the programmable current sources, a predetermined current signal may be generated by the programmable current source that processes the binary input signal.

Optionally, S225, which includes summing currents along each summation node of a pair of summation nodes, functions to sum a plurality of current signals at a first summation node and sum a plurality of current signals at a second summation node. Specifically, in a preferred embodiment, the programmable current sources may be arranged in pairs in which a first current source of the pair is in electrical communication with a first summation node and a second current source of the pair is in electrical communication with a second summation node. Further, multiple pairs of the programmable current sources may be arranged such that a first current source of each of the multiple pairs share (by way of electrical connection) the first summation node and a second current source of each of the multiple pairs share (by way of electrical connection) the second summation node. Thus, in such configuration, the first current source of each pair may supply a current to the first summation node and the second current source of each pair may supply another current to the second summation node.

Accordingly, S225 preferably functions to sum the current signals supplied to the first summation node as well as the current signals supplied to the second summation node by the array of programmable current sources.

S230, which includes applying a common current signal to each summation node of the pair of summation nodes, functions to measure an average voltage between the pair of summation nodes and responsively generate and source two common current signals to the pair of summation nodes. The two common current signals preferably have a same magnitude and direction. Thus, S230 may function to use the two common current signals to adjust the average voltage of the pair of summation nodes to match a predetermined target voltage.

In a preferred embodiment, S230 functions to generate the common current signals using a common-mode current circuit comprising two current sources and a microcontroller circuit. When implemented by S230, the microcontroller measures the average voltage of the pair of summation nodes, calculates a common current signal to achieve an average target voltage in the pair of summation nodes and sources the common current signal via the two common current sources to each summation node of the pair of summation nodes.

S240, which includes sourcing differential current signals to a pair of summation nodes, preferably functions to generate a search-based differential current signals having a same magnitude but opposite directions (i.e., one positive and one negative) to each of the first and second summation nodes of the pair. Additionally, or alternatively, S240 may function to source differential current signals to the pair of summation nodes having varying magnitudes and/or having a same (e.g., both positive signals or both negative signals) or opposite (e.g., one positive signal and one negative signal) direction.

In a preferred embodiment, S240 may function to implement a global reference signal source (e.g., a global DAC) together with an array of local differential current signal sources (e.g., a local DACs). The global reference signal source as implemented in S240 may function as a common reference signal source to the array of local differential current signal sources. For instance, an integrated circuit may implement an array or multiple columns of paired programmable current sources. In such instance, each column may include a common-mode current circuit, a local differential current signal source, at least one comparator, and optionally, a finite state machine or the like. Accordingly, the global reference signal source in such implementation may function to source along a shared signal path reference signals to each local differential current signal source arranged within each respective column of paired programmable current sources of the array.

In a preferred embodiment, the global reference signal source implemented by S240 comprises a global DAC and each of the local differential current signal sources comprise a local DAC. Preferably, the global DAC comprises an N-bit global DAC that functions to source a total of N bits of reference signals to the local DAC over a total of N cycles for performing a computation.

In a first implementation, S240 may function to cause the local differential current source to source a set of initial differential current signals to a first summation node and a second summation node (of a column in the array) in response to the detection of current signals within the first summation node and the second summation node potentially supplied by a pair of programmable current sources. In such implementation, the local differential current source may function to generate and source to the nodes the initial differential current signals based on an initial (or first) reference signal bit out of N total bits from the global reference signal source.

Still, in this first implementation, S240 may function to source subsequent differential current signals to the first and second summation nodes using the local differential current source in response to an output signal (S245) from one of a comparator or a finite state machine or the like. The output signal preferably indicates one or more of whether a voltage of the sum of the differential currents in the first summation node and the second summation node is greater than or less than a target voltage ($V_{TARGET}$) value or whether the voltage of the sum has crossed the $V_{TARGET}$ value.

In a second implementation, S240 may function to cause the local differential current source to source an initial set of differential current signals to a first summation node and a second summation node in response to an output signal from one of a comparator or a finite state machine or the like. That is, in this second implementation, the initial set of differential current signals may be sourced by the local differential current source only after the signal output from a comparator or finite state machine is first received. In such second implementation, the local differential current source may function to generate the initial differential current signals based on an initial (or first) reference signal bit out of N total bits from the global reference signal source.

Figure 9:
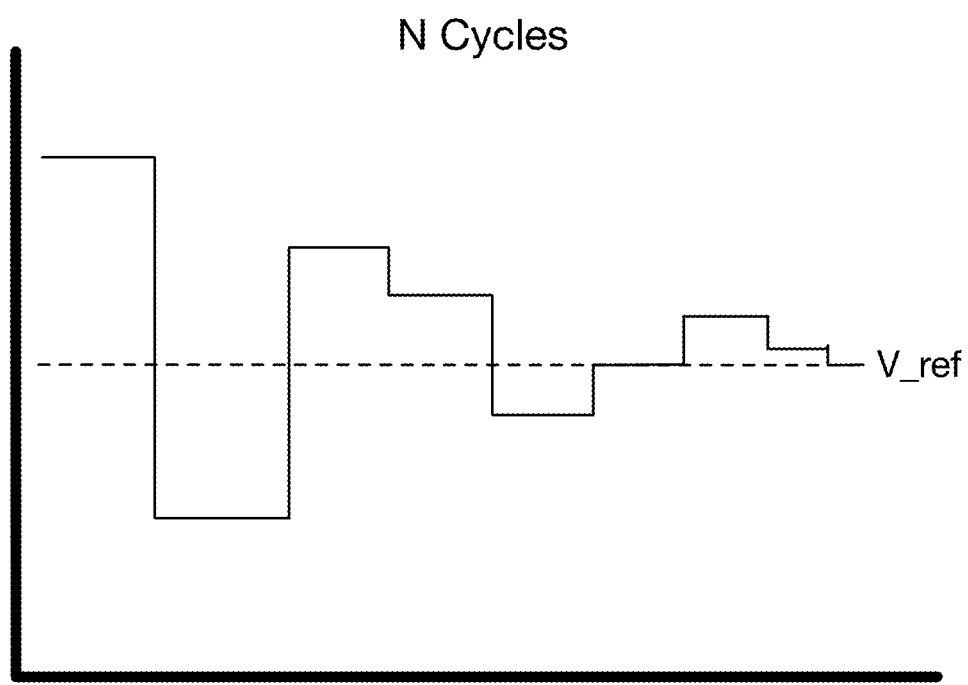
FIG. 9 illustrates a schematic of an N cycle calculation in accordance with one or more embodiments of the present application.

In a preferred embodiment, the global reference signal source may function to generate a set of N bit reference signals to an array of local differential current sources according to a predetermined pattern and/or according to a predetermined set of values. For instance, the global reference signal source may function to generate a set of N bit reference signals that diminish (or increase) in magnitude with the provision of each subsequent reference signal. In some embodiments, the diminishing of the reference signals of a set of N bit reference signals may be systematic and based on a predetermined decay algorithm. For instance, the global reference signal source may function to decay a magnitude of subsequent reference signals by one-half (e.g., ½, ¼, ⅛, ¹⁄₁₆, etc.) or any suitable fractional value or decay rate. Accordingly, for a set of N bit reference signal values from the global reference signal source, the values of the reference signals may diminish such that the first reference signal of the set of N bit reference signal values is the largest and the last reference signal of the set of N bit reference signal values is the smallest. Accordingly, a diminishing continuum of reference signal values for a set of N bit reference signals may be sourced to each local differential current source to allow a resultant voltage of the summation nodes to converge to a voltage reference at the end of N cycles, as shown by way of example in FIG. 9.

S245, which includes generating an output signal based on the differential current signals of the first and the second summation nodes, functions to assess the differential current signals along the first and the second summation nodes and return an output signal to the local differential current source. As mentioned above, the output signal preferably indicates a position of a measured voltage of the first and the second summation nodes with respect to a target voltage.

In a first implementation, S245 may function to implement a finite state machine to generate the output signal to the local differential current source. In this first implementation, S245 may function to determine a weighted sum difference of the current signals of the first and second summation nodes and a resultant voltage of the nodes and further, generate a comparison of the resultant voltage of the nodes to a preset target voltage value. S245 preferably outputs the comparison of the resultant voltage and the target voltage value to the finite state machine.

In this first implementation, the finite state machine is preferably implemented with two identifiable states and functions to output one of the two states to the local differential current source. For instance, the finite state machine may be preprogrammed to identify whether a resultant voltage of the first and second summation nodes is greater than (i.e., above) or less than (i.e., below) a target voltage value. In another instance, the finite state machine may be preprogrammed to identify whether a resultant voltage of the first and second summation nodes has crossed a target voltage value or has not crossed the target voltage value. At the finite state machine, S245 may function to determine a definitive It shall be noted that while the finite state machine may be implemented in this first implementation with only two identifiable states, the finite state machine may be implemented with any number (e.g., 3, 4, 5, 6 . . . n states) of states and function to output one state from the available number of states.

In a second implementation, S245 may function to implement a plurality of comparators (e.g., three comparators) to decipher a state of the voltage of the pair of summation nodes relative to a target voltage at the comparators. For instance, a first comparator may function to determine whether the voltage of the pair of summation nodes is greater than (above) the target voltage, a second comparator may function to determine whether the voltage of the pair of summation nodes crosses the target voltage, and a third comparator may function to determine whether the voltage of the pair of summation nodes is less than (below) the target voltage. The output of the plurality of comparators may be fed back to the local differential current source.

Accordingly, upon receipt of an output signal from S245, S240 preferably functions to source a set of differential currents to the first summation node and the second summation node. Preferably, the local differential current source functions to generate differential current signals that source or sink current from the first and second summation nodes based on a value of the output signal from the finite state machine or the like. That is, if the output signal supplied by the finite state machine indicates that a resultant voltage of the first and second summation nodes is below (or less than) a target voltage, then the local differential current source may function to generate differential current signals that increases the summed difference current signal value of the first and second summation nodes and consequently, the resultant voltage value of the nodes. In this way, the resultant voltage of the nodes moves toward the target voltage. Conversely, if the output signal supplied by the finite state machine indicates that a resultant voltage of the first and second summation nodes is above (or greater than) a target voltage, then the local differential current source may function to generate differential current signals that reduces (sinks) the summed difference current signal value of the first and second summation nodes and consequently, reduces the resultant voltage of the nodes.

Additionally, or alternatively, S245 may function to record the activity of the local differential current source during the N cycles. That is, for each set of differential current signals that the local differential current source sinks or sources to the first and second summation nodes during each cycle of N cycles, S245 functions to record each set of differential current signal value.

S250, which includes computing a weighted sum difference of the pair of summation nodes, functions to approximate the weighted sum difference of the pair of summation nodes in response to a completion of the N cycles.

Specifically, S250 may function to calculate a weighted sum difference of the pair of summations nodes by first approximating the voltage value of the weighted sum difference of the first and second summation nodes to be the target reference voltage at the comparator at the end of N cycles. S250 may subsequently function to reduce the approximate voltage value of the first and second summation nodes by the voltages of the differential current signals sourced by the local differential current source during the N cycles. S250 may additionally reduce the approximate voltage value of the first and second summation nodes by the voltages sourced or sunk to the first and the second summation nodes based on the common-mode current signals of the common-mode current circuit (S230).

Accordingly, once a reduced voltage value of the first and the second summation nodes is calculated, S250 may function to calculate the weighted sum difference of the current signals of the first and second summation node based on resistor value ($R_{app}$) applied at the comparator or before the summed current signals of the first and second summation nodes entered the comparator. An example of a calculation to determine the weighted sum difference of the current signals of the first and the second summation nodes may be (e.g., $I_{weighted\ sum\ diff} = V_{red}/R_{app}$).

Additionally, or alternatively, S250 may function to convert the weighted sum difference of the current signals to an output code that corresponds to the matrix multiply calculation.

In one variant in which a single-ended integrated circuit may be implemented, S250 may function to determine a sum current value along a single summation node based on an output crossing signal. In such implementation, the global reference signal source may provide sequential reference signal bit inputs to a local current source (local DAC). In turn, the local current source may function to source or sink current signals to the single summation node based on the sequential reference signal bit inputs.

In this variant, the summed current signals along the single summation node may be converted to a voltage entering into a comparator. S250 may function to compare the voltage of the single summation node to a voltage reference. Specifically, S250 may function to collect or pass a value of the comparator circuit to a counter circuit that may function to record a time at which the compared voltage values crossed. The recorded time may be compared to the times at which the digital signal was active in the local current source to generate the current signal sourced or sunk to the single summation node.

Specifically, S250 may function identify a time or an instance at which the voltage value of the single summation node is equal to the voltage reference at the comparator. Additionally, or alternatively, S250 may function to identify a time or an instance at which the voltage value of the single summation node crosses the voltage reference at the comparator. S250 may function to record a time at which the voltage of the single summation node is equal to or crosses the voltage reference.

Using a time at which an equivalence was detected between the voltage of the single summation node and the voltage reference or a time at which the voltage of the single summation node crossed the voltage reference, S250 may function to identify an associated digital input code or reference signal (from the global signal reference source) into the local current source that generated the voltage of the single summation node at the time of equivalence with the voltage reference or at the time of crossing the voltage reference.

Additionally, or alternatively, S250 may function to output a digital code (e.g., a multi-bit signal) that corresponds to a digital code input or active within the DAC at the time at which the compared current values crossed.

It shall be understood that the method 200 is an exemplary method that may be implemented in any suitable order to achieve the inventions and/or embodiments of the inventions within the purview or that may be easily contemplated in view of the disclosure provided herein. Thus, the order and process steps should not be limited to the exemplary order provided herein.

The methods of the preferred embodiment and variations thereof can be embodied and/or implemented at least in part as a machine configured to receive a computer-readable medium storing computer-readable instructions. The instructions are preferably executed by computer-executable components preferably integrated with the lithography system and one or more portions of the processors and/or the controllers implemented thereby. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

Although omitted for conciseness, the preferred embodiments include every combination and permutation of the various methods, apparatus, and systems described herein.

As a person skilled in the art will recognize from the previous detailed description and from the figures and claims, modifications and changes can be made to the preferred embodiments of the invention without departing from the scope of this invention defined in the following claims.

What is claimed is:

1. An integrated circuit comprising:
    a signal source that sources one or more signals to an array of local signal sources, wherein a distinct one local signal source of the array of local signal sources is arranged in electrical communication with a pair of electrical conduits;
    a circuit that:
        (i) determines a summed difference current value between electrical current values of the pair of electrical conduits; and
        (ii) computes a binary output value based on the summed difference current value;
    wherein the circuit comprises:
        a control circuit that sources to or sinks from each electrical conduit of the pair of electrical conduits an electrical current value; and
        sets a target voltage condition between the pair of electrical conduits based on the electrical current values.

2. The integrated circuit according to claim 1, wherein the control circuit generates the electrical current value based on a measured voltage value of the pair of electrical conduits.

3. The integrated circuit according to claim 1, wherein the circuit comprises:
    comparator circuitry that evaluates analog values based on outputs of the pair of electrical conduits and generates the binary output value based on the evaluation.

4. The integrated circuit according to claim 3, wherein the evaluation by the comparator circuitry includes:
    assessing a relative state of a summed current value in each of a first electrical conduit and of a second electrical conduit of the pair of electrical conduits, and
    determining which of the first electrical conduit and the second electrical conduit has a larger summed current value or a smaller summed current value.

5. The integrated circuit according to claim 1, wherein the circuit comprises:
    a finite state machine that evaluates analog values based on outputs of the pair of electrical conduits and generates the binary output value based on the evaluation.

6. The integrated circuit according to claim 1, further comprising:
    multiple arrays of distinct pairs of tunable resistors;
    multiple pairs of electrical conduits, wherein:
        each of the multiple arrays of distinct pairs of tunable resistors is arranged along one pair of the multiple pairs of electrical conduits, and
        the circuit comprises an analog multiplexor that is arranged in electrical communication with each of the multiple pairs of electrical conduits.

7. The integrated circuit according to claim 6, wherein:
    the analog multiplexor receives weighted summed current values from each of the multiple pairs of electrical conduits,
    the analog multiplexor alternates into the circuit the weighted summed current values from each of the multiple pairs of electrical conduits.

8. The integrated circuit according to claim 7, wherein:
    output states for each of the multiple pairs of electrical conduits are output, and
    the circuit outputs a binary output value for each of the multiple pairs of electrical conduits based on an arrangement of the output states.

9. The integrated circuit according to claim 1, further comprising:
    multiple arrays of distinct pairs of tunable resistors;
    multiple pairs of electrical conduits, wherein:
        each of the multiple arrays of distinct pairs of tunable resistors is arranged along one pair of the multiple pairs of electrical conduits,
        the distinct one local signal source of the array of local signal sources is arranged in electrical communication with each of the multiple pairs of electrical conduits.

10. The integrated circuit according to claim 9, wherein the distinct one local signal source sources a signal to each of the multiple pairs of electrical conduits based on the one or more signals from the signal source.

11. The integrated circuit according to claim 1, wherein the circuit changes a differential current value between the pair of electrical conduits until a summation of an output of a first current value of a first electrical conduit and a second current value of a second electrical conduit of the pair of electrical conduits equals zero.

12. The integrated circuit according to claim 1, wherein the circuit increases or decreases a differential current signal between the pair of electrical conduits by sourcing to one of a first electrical conduit and a second electrical conduit of the pair of electrical conduits a progressively smaller differential current signal increment based on which of the first electrical conduit and the second electrical conduit that outputs a current signal value with a higher magnitude.

13. The integrated circuit according to claim 1, wherein the signal source executes a binary search algorithm such that at each step of the binary search algorithm, the signal source sets a binary-weighted value with which each of the array of local signal sources to adjust a respective local state of each of the array of local signal sources.

14. The integrated circuit according to claim 1, wherein the signal source executes one of a least significant bit search algorithm, a non-binary search algorithm, a logarithmic search algorithm, and a custom user-defined search function.

15. The integrated circuit according to claim 1, wherein the control circuit comprises one of a single-amplifier driven circuit and a switched capacitor feedback circuit that sources an electrical current value to each of the pair of electrical conduits.

16. The integrated circuit according to claim 15, wherein the switched capacitor feedback circuit includes:
    a first amplifier that drives a target voltage value that tracks a generated feedback voltage; and
    a second amplifier that shields against sensitive output voltages from switching signals in the switched capacitor feedback circuit.

17. The integrated circuit according to claim 1, wherein the control circuit comprises a compensation circuit that includes at least two amplifiers that are each arranged in electrical communication with one of two transistors and that each drive a gate voltage at each of the two transistors to a desired voltage.

18. The integrated circuit according to claim 1, wherein the control circuit comprises a compensation circuit that includes a single amplifier that is each arranged in electrical communication with each of two transistors and that switches between each of the two transistors to drive a gate voltage at each of the two transistors to a desired voltage.

19. An integrated circuit comprising:
a signal source that sources one or more signals to an array of local signal sources, wherein a distinct one local signal source of the array of local signal sources is arranged in electrical communication with a pair of electrical signal paths;
a converter circuit that:
  (i) determines a summed difference current value between the electrical current values of the pair of electrical signal paths; and
  (ii) computes a binary output value based on the summed difference current value;
wherein the converter circuit:
  comparator circuitry that evaluates analog values based on outputs of the pair of electrical conduits and generates the binary output value based on the evaluation.

20. An integrated circuit comprising:
a signal source that sources one or more signals to an array of local signal sources, wherein a distinct one local signal source of the array of local signal sources is arranged in electrical communication with a pair of electrical conduits;
a circuit that:
  (i) determines a summed difference current value between electrical current values of the pair of electrical conduits; and
  (ii) computes a binary output value based on the summed difference current value;
wherein the circuit comprises:
  a finite state machine that evaluates analog values based on outputs of the pair of electrical conduits and generates the binary output value based on the evaluation.

\* \* \* \* \*